US011495406B2

(12) United States Patent
Berolini et al.

(10) Patent No.: US 11,495,406 B2
(45) Date of Patent: Nov. 8, 2022

(54) MULTILAYER CERAMIC CAPACITOR HAVING ULTRA-BROADBAND PERFORMANCE

(71) Applicant: AVX Corporation, Fountain Inn, SC (US)

(72) Inventors: Marianne Berolini, Greenville, SC (US); Jeffrey A. Horn, Simpsonville, SC (US); Richard C. VanAlstine, Piedmont, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 217 days.

(21) Appl. No.: 16/751,299

(22) Filed: Jan. 24, 2020

(65) Prior Publication Data

US 2020/0243264 A1    Jul. 30, 2020

Related U.S. Application Data

(60) Provisional application No. 62/797,515, filed on Jan. 28, 2019.

(51) Int. Cl.
 *H01G 4/232* (2006.01)
 *H01G 4/12* (2006.01)
 (Continued)

(52) U.S. Cl.
 CPC .......... *H01G 4/232* (2013.01); *G01R 31/016* (2013.01); *H01G 2/065* (2013.01); *H01G 4/012* (2013.01); *H01G 4/1218* (2013.01); *H01G 4/30* (2013.01)

(58) Field of Classification Search
 CPC ...... G01R 31/016; H01G 4/232; H01G 2/065; H01G 4/012; H01G 4/30; H01G 4/1218
 (Continued)

(56) References Cited

U.S. PATENT DOCUMENTS 5,021,921 A   6/1991 Sano et al.
5,719,539 A   2/1998 Ishizaki et al.
(Continued)

FOREIGN PATENT DOCUMENTS

EP   0 929 087 B1   5/2007
JP   H 066105 A    1/1994
(Continued)

OTHER PUBLICATIONS

AVX Product Information on MLCC with FLEXITERM®, 207, 5 pages.
(Continued)

*Primary Examiner* — Arun Ramaswamy
(74) *Attorney, Agent, or Firm* — Dority & Manning, P.A.

(57) ABSTRACT

The present invention is directed to a multilayer ceramic capacitor that includes a plurality of active electrodes and at least one shield electrode that are each arranged within a monolithic body and parallel with a longitudinal direction. The capacitor may exhibit a first insertion loss value at a test frequency, which may be greater than about 2 GHz, in a first orientation relative to the mounting surface. The capacitor may exhibit a second insertion loss value at about the test frequency in a second orientation relative to the mounting surface and the capacitor is rotated 90 degrees or more about the longitudinal direction with respect to the first orientation. The longitudinal direction of the capacitor may be parallel with the mounting surface in each of the first and second orientations. The second insertion loss value may differ from the first insertion loss value by at least about 0.3 dB.

20 Claims, 15 Drawing Sheets

(51) Int. Cl.
  *H01G 4/30* (2006.01)
  *H01G 2/06* (2006.01)
  *H01G 4/012* (2006.01)
  *G01R 31/01* (2020.01)

(58) Field of Classification Search
  USPC ................. 361/321.1, 301.4, 303, 306.3
  See application file for complete search history.

(56) References Cited

U.S. PATENT DOCUMENTS

| | | | |
|---|---|---|---|
| 6,020,799 A | 2/2000 | Ishizaki et al. | |
| 6,304,156 B1 | 10/2001 | Ishizaki et al. | |
| 6,310,759 B2 | 10/2001 | Ishigaki et al. | |
| 6,587,327 B1 | 7/2003 | Devoe et al. | |
| 6,771,485 B2 | 8/2004 | Yokoyama et al. | |
| 6,816,356 B2 | 11/2004 | Devoe et al. | |
| 6,970,341 B1 | 11/2005 | Devoe et al. | |
| 7,068,124 B2 | 6/2006 | White et al. | |
| 7,085,124 B2 | 8/2006 | Togashi | |
| 7,177,137 B2 | 2/2007 | Ritter et al. | |
| 7,265,964 B1 | 9/2007 | Togashi | |
| 7,336,475 B2 | 2/2008 | Bultitude et al. | |
| 7,334,981 B2 | 3/2008 | Ritter et al. | |
| 7,463,474 B2 | 12/2008 | Ritter et al. | |
| 7,675,729 B2 | 3/2010 | Anthony et al. | |
| 7,715,173 B2 | 5/2010 | Bultitude et al. | |
| 7,843,679 B2 | 11/2010 | Togashi | |
| 7,859,821 B2 | 12/2010 | Shimizu | |
| 8,446,705 B2 | 5/2013 | Ritter et al. | |
| 8,576,538 B2 | 11/2013 | Kuroda et al. | |
| 8,780,523 B2 | 7/2014 | Seo et al. | |
| 8,885,319 B2 | 11/2014 | Bultitude et al. | |
| 9,087,648 B2 | 7/2015 | Bultitude et al. | |
| 9,418,789 B2 | 8/2016 | Lee et al. | |
| 9,490,072 B2 | 11/2016 | Bultitude et al. | |
| 9,786,436 B2 | 10/2017 | Itamura | |
| 9,799,449 B2 | 10/2017 | Hill et al. | |
| 9,812,259 B2 | 11/2017 | Lee et al. | |
| 9,843,299 B2 | 12/2017 | Ahn et al. | |
| 9,847,173 B2 | 12/2017 | Taniguchi et al. | |
| 9,893,703 B2 | 2/2018 | Ahn et al. | |
| 9,899,151 B2 | 2/2018 | Itamura | |
| 9,997,295 B2 | 6/2018 | Fujita et al. | |
| 10,083,795 B2 | 9/2018 | Itamura | |
| 10,304,629 B2 | 5/2019 | Kitamura et al. | |
| 10,943,735 B2 | 3/2021 | Hom et al. | |
| 2005/0057886 A1* | 3/2005 | Mruz .................. | H01G 4/40 361/306.2 |
| 2005/0248908 A1 | 11/2005 | Dreezen et al. | |
| 2010/0039749 A1* | 2/2010 | Ritter .................. | H01G 4/005 361/301.4 |
| 2012/0154977 A1 | 6/2012 | Hur et al. | |
| 2012/0297596 A1 | 11/2012 | Bultitude et al. | |
| 2016/0381802 A1* | 12/2016 | Taniguchi .......... | H05K 1/0243 174/260 |
| 2018/0374646 A1 | 12/2018 | Ward et al. | |
| 2019/0279819 A1 | 9/2019 | Hom et al. | |
| 2020/0243259 A1 | 7/2020 | Berolini et al. | |
| 2020/0243260 A1 | 7/2020 | Berolini et al. | |
| 2020/0243261 A1 | 7/2020 | Berolini et al. | |
| 2020/0243265 A1 | 7/2020 | Berolini et al. | |
| 2020/0343046 A1 | 10/2020 | Hodgkinson et al. | |

FOREIGN PATENT DOCUMENTS

| | | |
|---|---|---|
| JP | H 10275745 A | 10/1998 |
| JP | 2002343677 A | 11/2002 |
| JP | 2012138391 A | 7/2012 |
| JP | 2015070144 A | 4/2015 |

OTHER PUBLICATIONS

AVX Product Information on Flexisafe MLC Chips, 2017, 1 pages.
Johnson et al., "Nonlinear Acoustic Effects in Multilayer Ceramic Capacitors," *Nations Institute of Standards and Technology*, Jan. 2013, 9 pages.
KEMET Electronics Corporation—Surface Mount Multilayer Ceramic Chip Capacitors (SMD MLCCs), Open Mode Design (FO-CAP), X7R Dielectric 16-200 VDC (Commercial and Automotive Grade), Sep. 9, 2019, 25 pages.
KEMET Corporation—KEMET Introduces FO-CAP Combining Flexible Termination With Open Mode Chip Design Technology, Aug. 2, 2011, 3 pages.
Keimasai et al., "Flex Cracking of Multilayer Ceramic Capacitors Assembled withPb-Free and Tin-Lead Solders," *IEEE Transactions on Device and Materials Reliability*, vol. 8, No. 1, Mar. 2008, pp. 182-192.
Keimasi, Mohammadreza (Doctorate)—"Flex Cracking and Temperature-Humidity-Bias Effects on Reliability of Multilayer Ceramic Capacitors," 2007, 181 pages.
Liu, et al., "Reliability Evaluation of Base-Metal-Electrode Multilayer Ceramic Capacitors for Potential Space Applications," *Materials Science*, 2011, 19 pages (nepp,nasa.gov).
Prymak et al., "New Improvements in Flex Capabilities for MLC Chip Capacitors," *2006 CARTS Conference*, Apr. 3-6, Components Technology Institute, Inc., 11 pages.
Sloka et al., "Flexure Robust Capacitors," KEMET, Jan. 2007, 12 pages.
Watkins, James Robert (Doctorate)—"Evaluating the Susceptibility of Electronic Components Assembled with Leaded Solder to Flexural Failures, with High Rate Considerations," 2008, 126 pages.
International Search Report and Written Opinion for PCT/US2020/014889 dated May 21, 2020, 11 pages.

* cited by examiner

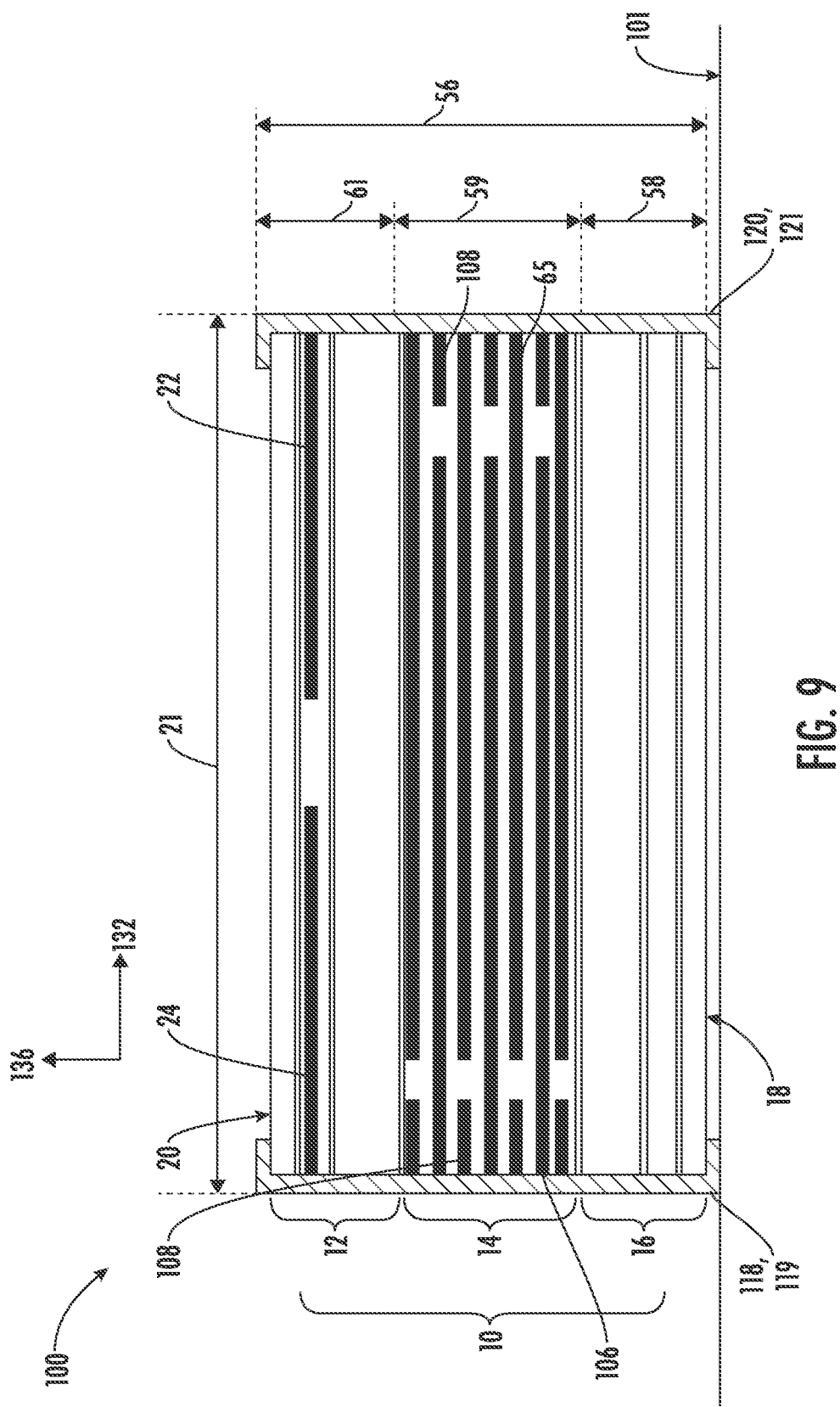

MULTILAYER CERAMIC CAPACITOR HAVING ULTRA-BROADBAND PERFORMANCE

CROSS REFERENCE TO RELATED APPLICATION

The present application claims filing benefit of U.S. Provisional Patent Application Ser. No. 62/797,515 having a filing date of Jan. 28, 2019, which is incorporated herein by reference in its entirety.

BACKGROUND OF THE INVENTION

The diversity of modern technical applications creates a need for efficient electronic components and integrated circuits for use therein. Capacitors are a fundamental component used for filtering, coupling, bypassing and other aspects of such modern applications which may include wireless communications, alarm systems, radar systems, circuit switching, matching networks, and many other applications. A dramatic increase in the speed and packing density of integrated circuits requires advancements in coupling capacitor technology in particular. When high-capacitance coupling capacitors are subjected to the high frequencies of many present applications, performance characteristics become increasingly more important. Because capacitors are fundamental to such a wide variety of applications, their precision and efficiency is imperative. Many specific aspects of capacitor design have thus been a focus for improving their performance characteristics.

SUMMARY OF THE INVENTION

In accordance with one embodiment of the present invention, a broadband multilayer ceramic capacitor may have a first end and a second end that is spaced apart from the first end in a longitudinal direction that is perpendicular to a lateral direction. The lateral direction and longitudinal direction may each be perpendicular to a Z-direction. The broadband multilayer ceramic capacitor may include a monolithic body including a plurality of dielectric layers, a first external terminal disposed along the first end, and a second external terminal disposed along the second end. The broadband multilayer ceramic capacitor may include a plurality of active electrodes arranged within the monolithic body and parallel with the longitudinal direction. The broadband multilayer ceramic capacitor may include at least one shield electrode arranged within the monolithic body and parallel with the longitudinal direction. The broadband multilayer ceramic capacitor may exhibit a first insertion loss value at a test frequency and in a first orientation relative to the mounting surface in which the longitudinal direction of the multilayer ceramic capacitor is parallel with the mounting surface. The test frequency may be greater than about 2 GHz. The broadband multilayer ceramic capacitor may exhibit a second insertion loss value at about the test frequency in a second orientation relative to the mounting surface in which the longitudinal direction of the multilayer ceramic capacitor is parallel with the mounting surface and the broadband multilayer ceramic capacitor is rotated 90 degrees or more about the longitudinal direction with respect to the first orientation. The second insertion loss value may differ from the first insertion loss value by at least about 0.3 dB.

In accordance with another embodiment of the present invention, a method of forming a broadband multilayer ceramic capacitor may include forming a plurality of active electrodes on a plurality of active electrode layers and forming at least one shield electrode on at least one shield electrode layer. The first shield electrode may extend to a first end of a monolithic body of the capacitor. The method may include stacking the plurality of active electrode layers and the shield electrode layer to form the monolithic body such that the plurality of active electrode layers and plurality of shield electrodes are parallel with a longitudinal direction of the capacitor. The broadband multilayer ceramic capacitor may exhibit a first insertion loss value at a test frequency and in a first orientation relative to the mounting surface in which the longitudinal direction of the multilayer ceramic capacitor is parallel with the mounting surface. The test frequency may be greater than about 2 GHz. The broadband multilayer ceramic capacitor may exhibit a second insertion loss value at about the test frequency in a second orientation relative to the mounting surface in which the longitudinal direction of the multilayer ceramic capacitor is parallel with the mounting surface and the broadband multilayer ceramic capacitor is rotated 90 degrees or more about the longitudinal direction with respect to the first orientation. The second insertion loss value may differ from the first insertion loss value by at least about 0.3 dB.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 9 illustrates the capacitor of FIG. 1E in the second orientation; and

DETAILED DESCRIPTION OF THE PREFERRED EMBODIMENTS

Figure 1A:
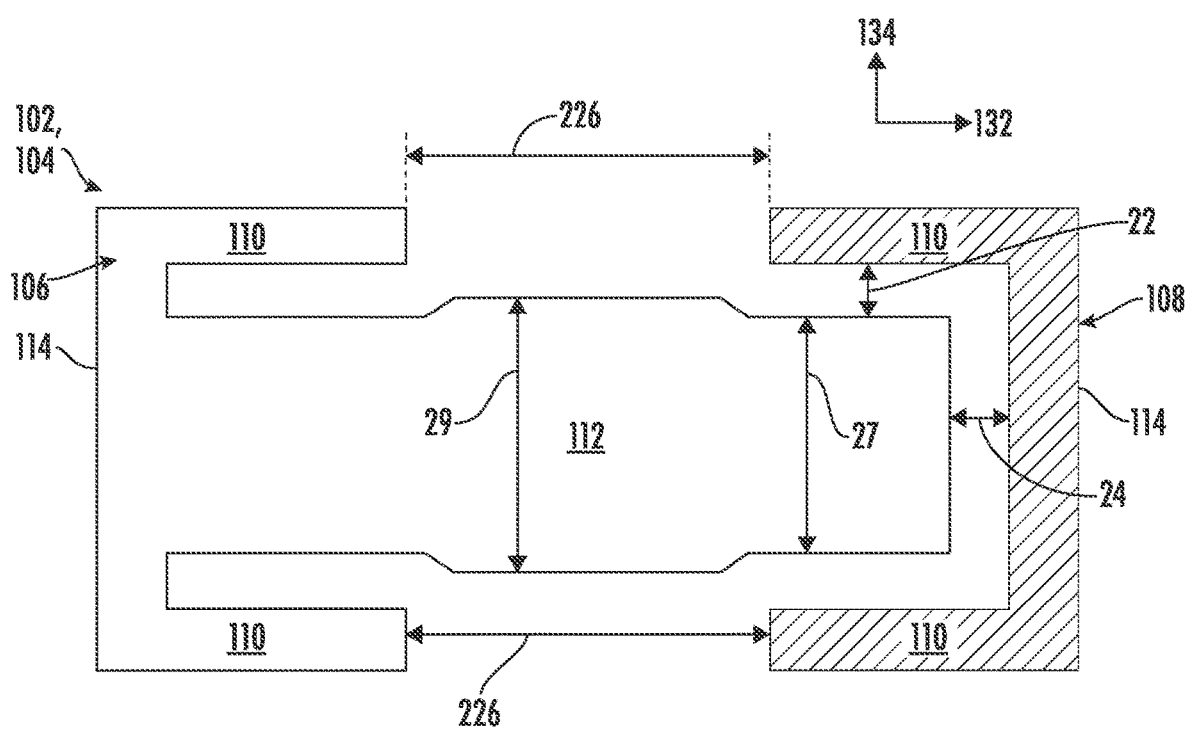
FIG. 1A illustrates a top view of one embodiment of an active electrode layer according to aspects of the present disclosure.

It is to be understood by one of ordinary skill in the art that the present discussion is a description of exemplary embodiments only, and is not intended as limiting the broader aspects of the present invention.

Generally speaking, the present invention is directed to a multilayer ceramic capacitor. In particular, the multilayer ceramic capacitor contains alternating dielectric layers and electrode layers within a single, monolithic body.

The multilayer ceramic capacitor exhibits excellent insertion loss characteristics in a first orientation relative to a mounting surface. For example, the capacitor may exhibit an insertion loss that is greater than about −0.5 dB from about 1 GHz to about 40 GHz, in some embodiments greater than about −0.4 dB, in some embodiments greater than about −0.35 dB, and in some embodiments greater than about −0.3 dB. In some embodiments the capacitor may exhibit an insertion loss that is greater than about −0.4 dB at about 10 GHz, in some embodiments greater than about −0.35 dB at about 10 GHz, in some embodiments greater than about −0.3 dB, and in some embodiments greater than about −0.25 dB at about 10 GHz. The capacitor may exhibit an insertion loss that is greater than about −0.4 dB at about 20 GHz, in some embodiments greater than about −0.35 dB at about 20 GHz, and in some embodiments greater than about −0.3 dB at about 20 GHz. The capacitor may exhibit an insertion loss that is greater than about −0.4 dB at about 30 GHz, in some embodiments greater than about −0.35 dB at about 30 GHz, in some embodiments greater than about −0.3 dB at about 30 GHz, and in some embodiments greater than about −0.25 dB at about 30 GHz. The capacitor may exhibit an insertion loss that is greater than about −0.4 dB at about 40 GHz, in some embodiments greater than about −0.35 dB at about 40 GHz, in some embodiments greater than about −0.3 dB at about 40 GHz, and in some embodiments greater than about −0.25 dB at about 40 GHz.

In some embodiments, the broadband multilayer ceramic capacitor may exhibit an insertion loss that ranges from about −0.05 dB to about −0.4 dB from about 5 GHz to about 20 GHz, in some embodiments from about −0.05 dB to about −0.3 dB from about 10 GHz to about 20 GHz, in some embodiments from about −0.05 dB to about −0.3 dB from about 20 GHz to about 30 GHz, and in some embodiments from about −0.05 dB to about −0.3 dB from about 30 GHz to about 40 GHz.

Aspects of the present disclosure are directed to a broadband multilayer capacitor that exhibits orientation sensitive insertion loss characteristics. For example, the capacitor may exhibit the first insertion loss value at a test frequency that is greater than about 2 GHz in the first orientation (for example as described above) and exhibit a second insertion loss value at about the test frequency in a second orientation that differs from the first insertion loss by at least about 0.3 dB, in some embodiments at least about 0.4 dB, in some embodiments at least about 0.5 dB.

In the first orientation, the plurality of active electrodes may be parallel with the mounting surface. One or more shield electrodes may be disposed between the plurality of active electrodes and the mounting surface. In some embodiments, the broadband multilayer ceramic capacitor may be free of shield electrodes above the plurality of active electrode layers in the Z-direction. In some embodiments, the broadband multilayer ceramic capacitor may be free of shield electrodes above a lowest electrode layer of the plurality of active electrode layers in the Z-direction.

In the second orientation, the capacitor may be rotated 90 degrees or more about the longitudinal direction with respect to the first orientation. However, in other embodiments, in the second orientation, the capacitor may be rotated 180 degrees about the longitudinal direction with respect to the first orientation.

The test frequency may range from about 2 GHz to about 20 GHz, in some embodiments from about 7 GHz to about 30 GHz, and in some embodiments from about 10 GHz to about 40 GHz.

The capacitor may have shield electrodes having a variety of configurations and/or locations that may improve the insertion loss characteristics of the capacitor in the first orientation. For example, in some embodiments, a first shield electrode may be approximately aligned with a second shield electrode and arranged between the plurality of active electrodes and the bottom surface of the capacitor in the first orientation. The first shield electrode may be connected with the first external terminal. The first shield electrode may have a first longitudinal edge aligned with the lateral direction and facing away from the first external terminal. The first shield electrode may have a second longitudinal edge aligned with the lateral direction and facing away from the first external terminal. The second longitudinal edge may be offset in the longitudinal direction from the first longitudinal edge by a shield electrode offset distance. The shield electrode region may include a second shield electrode connected with the second external terminal. The second shield electrode may be approximately aligned with the first shield electrode in the Z-direction.

A ratio of the capacitor length to the shield electrode offset distance may be greater than about 2, in some embodiments greater than about 5, in some embodiments, in some embodiments greater than about 10, in some embodiments greater than about 15, in some embodiments greater than about 20, and in some embodiments greater than about 40.

A first shield gap distance may be formed in the longitudinal direction between the first longitudinal edge of the first shield electrode and the first longitudinal edge of the second shield electrode. The capacitor may have a capacitor length in the longitudinal direction between the first end and the second end of the capacitor. A ratio of the capacitor length to the first shield gap distance may be greater than about 2, in some embodiments greater than about 5, in some embodiments, in some embodiments greater than about 10, in some embodiments greater than about 15, in some embodiments greater than about 20, and in some embodiments greater than about 40.

A second shield gap distance may be formed in the longitudinal direction between the second longitudinal edge of the first shield electrode and the second longitudinal edge of the second shield electrode. The first shield electrode may have a third longitudinal edge aligned with the lateral direction and facing away from the first external terminal. The second shield electrode may have a third longitudinal edge aligned with the lateral direction and facing away from the second external terminal. A third shield gap distance may be formed in the longitudinal direction between the third longitudinal edge of the first shield electrode and the third longitudinal edge of the second shield electrode. The first shield electrode may be symmetric in the lateral direction about a longitudinal centerline that extends in the longitudinal direction.

The first shield gap distance and/or second shield gap distance may range from about 10 microns to about 200 microns, in some embodiments from about 20 microns to about 150 microns, and in some embodiments from about 30 microns to about 80 microns.

The shield electrode offset distance may range from about 75 microns to about 300 microns, in some embodiments from about 100 microns to about 250 microns, and in some embodiments from about 125 microns to about 175 microns I. Example Embodiments Turning to FIGS. 1A-1E, one embodiment of a multilayer ceramic capacitor 100 is disclosed. FIG. 1E is a simplified side elevation view of the multilayer capacitor 100 mounted to a mounting surface 101, such a printed circuit board or substrate. The multilayer capacitor 100 may include a plurality of electrode regions 10 that are stacked in the Z-direction 136. The plurality of electrode regions 10 may include a dielectric region 12, an active electrode region 14, and a shield electrode region 16. The active electrode region 14 may be located between the dielectric region 12 and the shield electrode region 16 in the Z-direction 136. The dielectric region 12 may extend from the active electrode region 14 to a top surface 18 of the broadband multilayer ceramic capacitor 100. The capacitor 100 may include a bottom surface 20 opposite the top surface 18 in the Z-direction 136.

The electrode regions 10 may include a plurality of dielectric layers. Some dielectric layers may include electrode layers formed thereon. In general, the thickness of the dielectric layers and the electrode layers is not limited and can be any thickness as desired depending on the performance characteristics of the capacitor. For instance, the thickness of the electrode layers can be, but is not limited to, being about 500 nm or greater, such as about 1 μm or greater, such as about 2 μm or greater, such as about 3 μm or greater, such as about 4 μm or greater to about 10 μm or less, such as about 5 μm or less, such as about 4 μm or less, such as about 3 μm or less, such as about 2 μm or less. For instance, the electrode layers may have a thickness of from about 1 μm to about 2 μm. In addition, in one embodiment, the thickness of the dielectric layer may be defined according to the aforementioned thickness of the electrode layers. Also, it should be understood that such thicknesses of the dielectric layers may also apply to the layers between any active electrode layers, and/or shield electrode layers, when present and as defined herein.

In general, the present invention provides a multilayer capacitor having a unique electrode arrangement and configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The electrode layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. The electrodes may also be made of a low resistive material, such as silver, copper, gold, aluminum, palladium, etc. In one particular embodiment, the electrode layers may comprise nickel or an alloy thereof.

Referring again to FIG. 1E, in some embodiments, the dielectric region 12 may be free of electrode layers that extend greater than about 25% of a length 21 of the capacitor 100 from a first end 119 or a second end 120 of the capacitor 100 (schematically illustrated by box 21), in some embodiments free of electrode layers that extend greater than about 20% of the length of the capacitor, in some embodiments greater than about 15% of the length of the capacitor, in some embodiments greater than about 10% of the length of the capacitor, in some embodiments greater than about 5% of the length of the capacitor, and in some embodiments greater than about 2% of the length of the capacitor. For example, in such embodiments, the dielectric region 12 may include one or more floating electrodes and/or dummy electrode tabs. However, in other embodiments, the dielectric region 12 may be free of all electrode layers. In some embodiments, the broadband multilayer ceramic capacitor 100 may be free of shield electrodes 22, 24 above a plurality of active electrode layers 102, 104 in the Z-direction 136. In some embodiments, the broadband multilayer ceramic capacitor 100 may be free of shield electrodes 22, 24 above a lowest electrode layer 19 of the plurality of active electrode layers 102, 104 in the Z-direction 136.

The plurality of active electrode layers 102, 104 may be arranged within the active electrode region 14. Each active electrode layer 102, 104 may include one or more active electrodes, for example as described below with reference to FIGS. 1A through 1C. For example, in some embodiments each active electrode layer 102, 104 may include a first electrode 106 and a second electrode 108.

The multilayer capacitor 100 may contain a first external terminal 118 connected to the first electrode 106 of a first electrode layer 102 and a second (counter) electrode 108 of the second electrode layer 104. The multilayer capacitor 100 may include a second external terminal 120 connected to the first electrode 106 of the second electrode layer 104 and the second (counter) electrode 108 of the first electrode layer 102.

The shield electrode region 16 may include one or more shield electrodes, for example as described below with reference to FIG. 1D. For example, the shield electrode region 16 may include a first shield electrode 22 arranged within a monolithic body of the capacitor 100. The first shield electrode 22 may be parallel with the longitudinal direction 132. The first shield electrode 22 may be connected with the first external terminal 118. The shield electrode region 16 may include a second shield electrode 24, which may be connected with the second external terminal 120. The second shield electrode 24 may be approximately aligned with the first shield electrode 22 in the Z-direction 136.

In general, regarding embodiments discussed herein, the external terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

In one embodiment, the external terminals may be formed such that the external terminals are relatively thick. For instance, such terminals may be formed by applying a thick film stripe of a metal to exposed portions of electrode layers (e.g., by dipping the capacitor in a liquid external terminal material). Such metal may be in a glass matrix and may include silver or copper. As an example, such strip may be printed and fired onto the capacitor. Thereafter, additional plating layers of metal (e.g., nickel, tin, solder, etc.) may be created over the termination strips such that the capacitor is solderable to a substrate. Such application of thick film stripes may be conducted using any method generally known in the art (e.g., by a termination machine and printing wheel for transferring a metal-loaded paste over the exposed electrode layers).

The thick-plated external terminals may have an average thickness of about 150 μm or less, such as about 125 μm or less, such as about 100 μm or less, such as about 80 μm or less. The thick-plated external terminals may have an average thickness of about 25 μm or more, such as about 35 μm or more, such as about 50 μm or more, such as about 75 or more μm. For instance, the thick-plated external terminals may have an average thickness of from about 25 μm to about 150 μm, such as from about 35 μm to about 125 μm, such as from about 50 μm to about 100 μm.

In another embodiment, the external terminals may be formed such that the external terminal is a thin-film plating of a metal. Such thin-film plating can be formed by depositing a conductive material, such as a conductive metal, on an exposed portion of an electrode layer. For instance, a leading edge of an electrode layer may be exposed such that it may allow for the formation of a plated termination.

The thin-plated external terminals may have an average thickness of about 50 μm or less, such as about 40 μm or less, such as about 30 μm or less, such as about 25 μm or less. The thin-plated external terminals may have an average thickness of about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective electrode layers within a set of alternating dielectric layers and electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the electrode layers of the capacitor. For instance, when the electrode layer comprises nickel and the activation dopant comprises palladium, the palladium dopant may be introduced into the nickel ink or composition that forms the electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal may include at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as a barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the electrode layers. Such phenomena may be referred to as "self-determining" because the formation of the external plated terminals is determined by the configuration of the exposed conductive metal of the electrode layers at the selected peripheral locations on the capacitor. In some embodiments, the capacitor may include "dummy tabs" to provide exposed conductive metal along portions of the monolithic body of the capacitor that does not include other electrodes (e.g., active or shield electrodes).

It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

FIG. 1A illustrates a top view of one embodiment of an active electrode configuration for one or more electrodes in the active electrode region 14 according to aspects of the present disclosure. More specifically, the active electrode region 14 may include first electrode layers 102 and second electrode layers 104 in an alternating arrangement, for example as described below with reference to FIG. 1B. Referring to FIG. 1A, each electrode layer 102, 104 may include a first electrode 106 and a second electrode 108. The first electrode 106 may have a base portion 114 that extends along a longitudinal edge of the first electrode 106 in the lateral direction 134. The first electrode 106 may have a pair of electrode arms 110 extending from a base portion 114 in the longitudinal direction 132. The second electrode 108 may have a base portion 114 that extends along a longitudinal edge of the second electrode layer 108 in the lateral direction 134. The second electrode 108 may have a pair of electrode arms 110 extending from the base portion 114 in the longitudinal direction 132.

The electrode arm(s) 110 of the first electrode 106 may be generally longitudinally aligned with respective the electrode arm(s) 110 of the second electrode 108. Arm gap(s) 226 may be defined in the longitudinal direction 132 between aligned electrode arms 110 of the first and second electrodes 106, 108.

A central edge gap distance 23 may be defined in the lateral direction 134 between the central portion 122 of the first electrode and the second electrode arm 110. A central end gap distance 24 may be defined in the longitudinal direction 132 between the central portion 122 of the first electrode 106 and the base portion 114 of the second electrode 108. In some embodiments, the central edge gap distance 23 may be approximately equal to the central end gap distance 24.

The central portion 112 of the first electrode 106 may have a first width 27 at a first location and a second width 29 at a second location that is greater than the first width 27. The first location of the first width 27 may be offset from the second location of the second width in the longitudinal direction 132. Such a configuration may allow for adjustment of an overlapping area between central portions 112 of adjacent electrodes in the Z-direction 136 without changing the central edge gap distance 23.

Figure 1B:
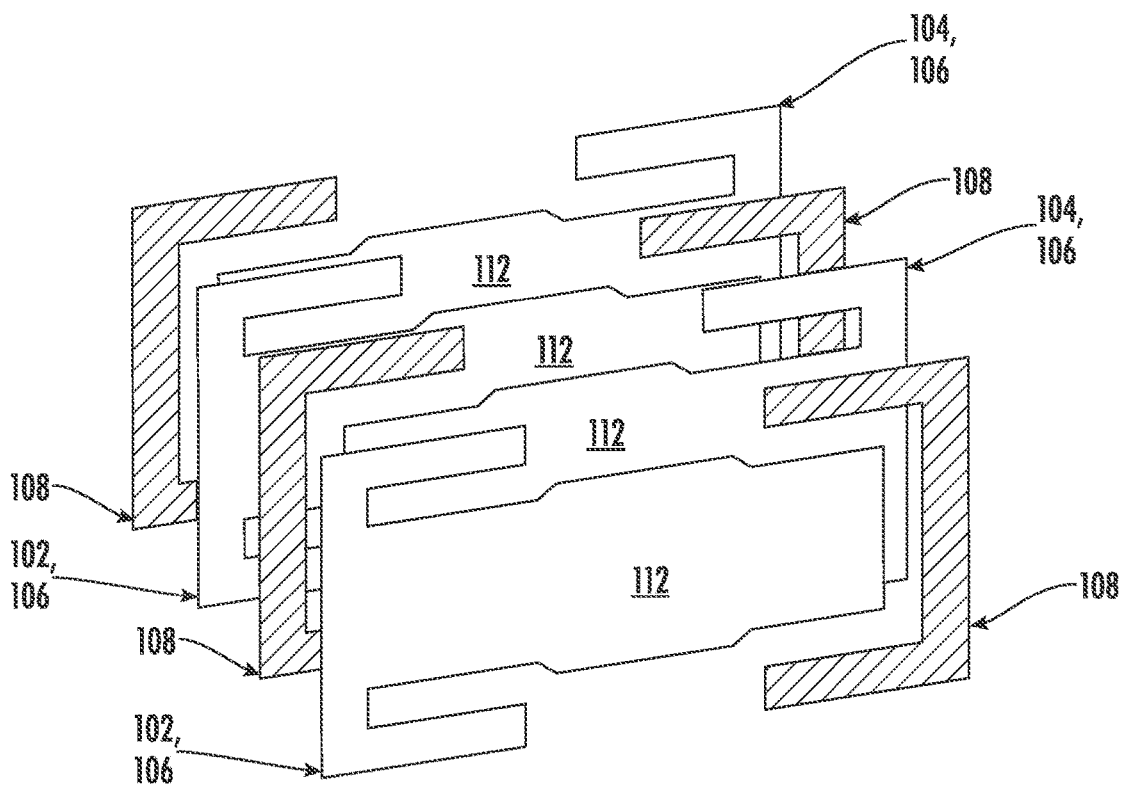
FIG. 1B illustrates a perspective view of alternating electrode layers configured as shown in FIG. 1A according to aspects of the present disclosure.

Referring to FIG. 1B, a plurality of first electrode layers 102 and a plurality of second electrode layers 104 may be arranged in an alternating, mirrored configuration. As illustrated, the central portions 112 of the respective electrode layers at least partially overlap. FIG. 1B illustrates a total of four electrode layers; however, it should be understood that any number of electrode layers may be employed to obtain the desired capacitance for the desired application.

Figure 1C:
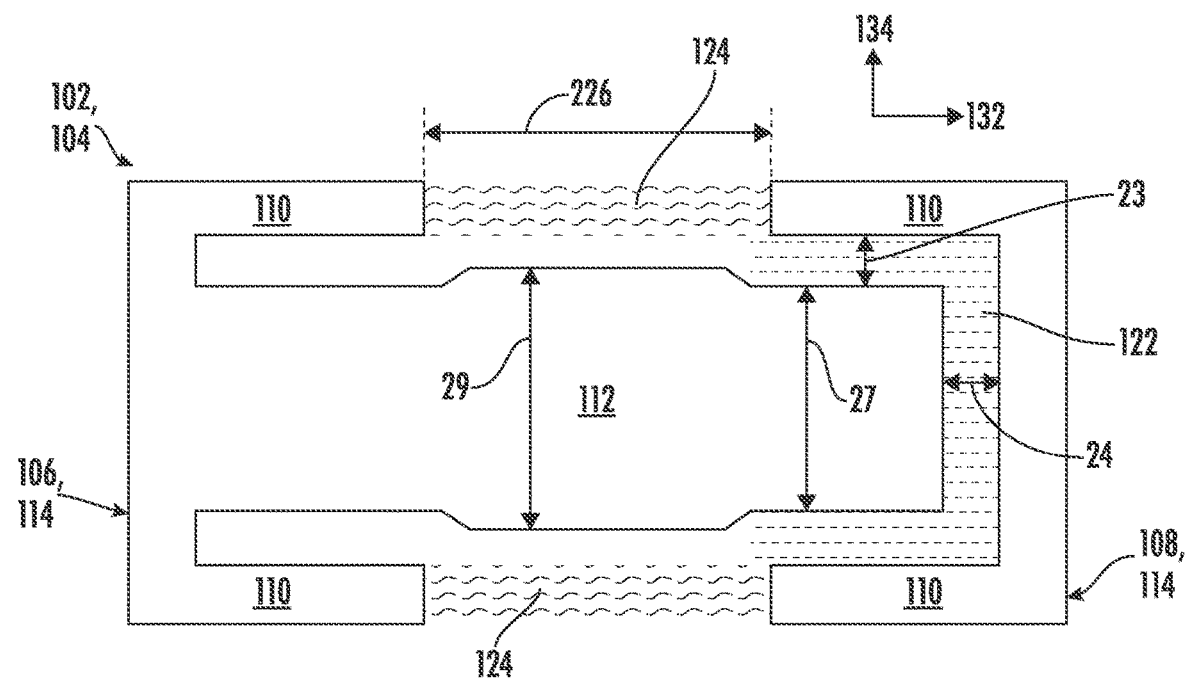
FIG. 1C illustrates a top down view of the embodiment of the active electrode layer of FIG. 1A in which multiple capacitive regions are formed according to aspects of the present disclosure.

Referring to FIG. 1C, several capacitive regions may be formed between the first electrode 106 and the second electrode 108. For example, in some embodiments, a central capacitive region 122 may be formed between the central portion 112 of the first electrode 106 and the base portion 114 and/or arms 128 of the second electrode 108. In some embodiments, an arm gap capacitive region 124 may be formed within the arm gap 240 between the electrode arms 110 of the first electrode 106 and the second electrode 108.

Figure 1D:
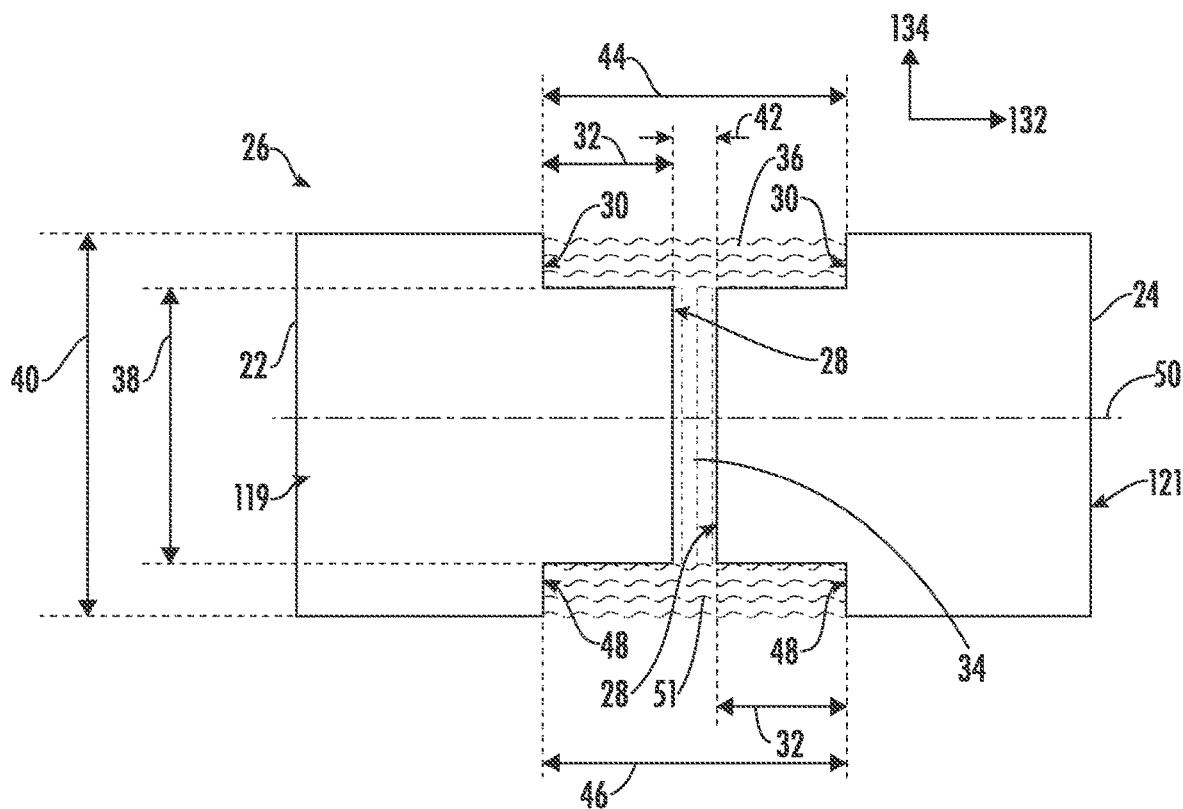
FIG. 1D illustrates a top down view of the embodiment of a shield electrode layer in which multiple capacitive regions are formed according to aspects of the present disclosure.
Figure 1E:
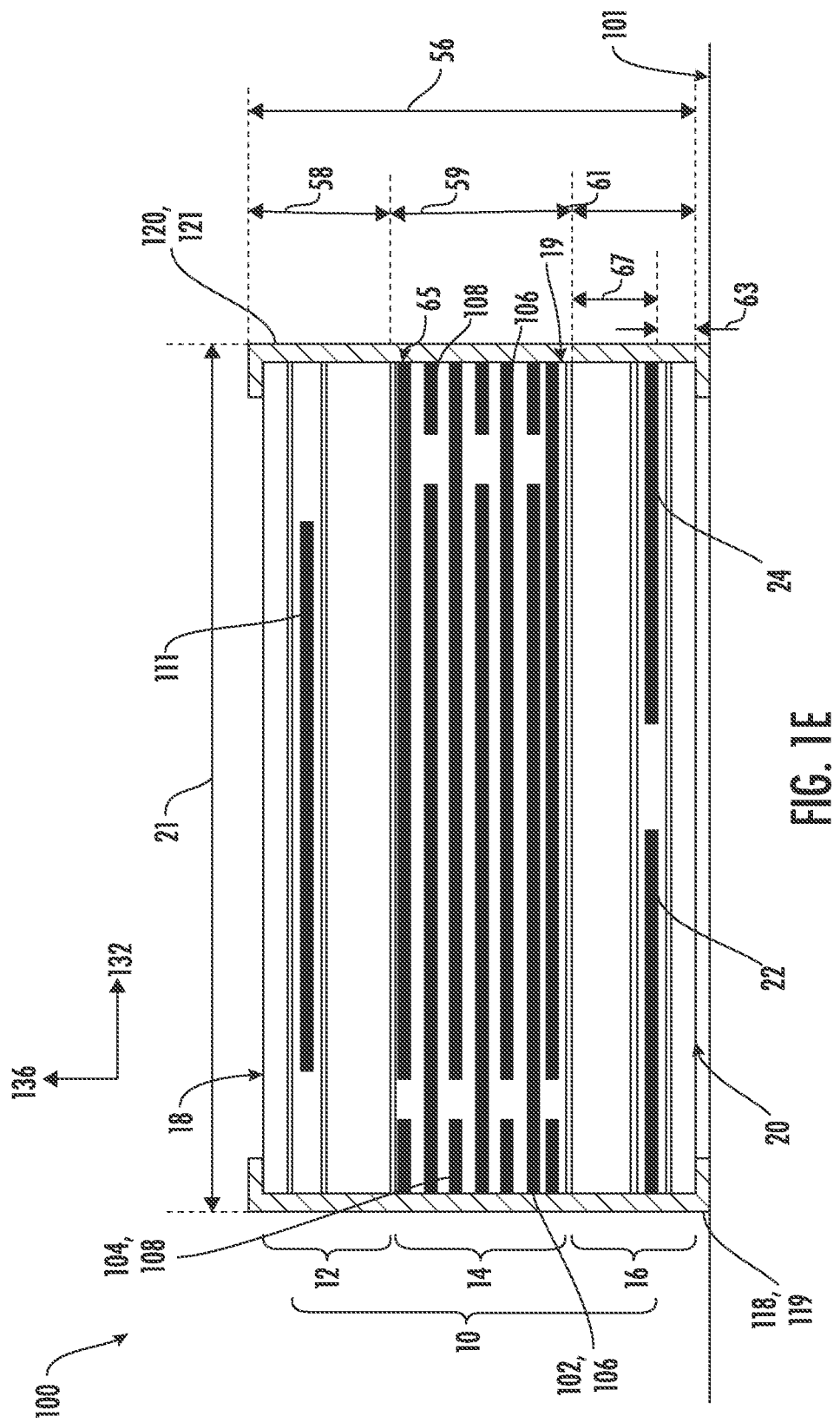
FIG. 1E illustrates a side cross sectional view of one embodiment of a capacitor including multiple regions in which active electrode layers are configured as shown in FIGS. 1A through 1C and a shield electrode layer is configured as shown in FIG. 1C according to aspects of the present disclosure.

FIG. 1D illustrates a shield electrode layer 26, which may be included within the shield electrode region 16 (illustrated in FIG. 1E) within the monolithic body of the capacitor 100. As indicated above, the first shield electrode 22 may be parallel with the longitudinal direction 132 (e.g., parallel with the top and bottom surfaces 18, 20 illustrated in FIG. 1E). The first shield electrode 22 may have a first longitudinal edge 28 aligned with the lateral direction 134 and facing away from the first external terminal 118 (shown in FIG. 1E) and first end 119. The first shield electrode 22 may have a second longitudinal edge 30 aligned with the lateral direction 134 and facing away from the first external terminal (shown in FIG. 1E) and first end 119. The second longitudinal edge 30 may be offset in the longitudinal direction 132 from the first longitudinal edge 28 by a shield electrode offset distance 32.

The second shield electrode 24 may be connected with the second external terminal 120 (illustrated in FIG. 1E) and the second end 121. The second shield electrode 24 may be approximately aligned with the first shield electrode 22 in the Z-direction 136 (illustrated in FIG. 1E). The second shield electrode 24 may have a similar configuration to the first shield electrode 22. For example, the second shield electrode 24 may have a first longitudinal edge 28 aligned with the lateral direction 134 and facing away from the second external terminal 120 (illustrated in FIG. 1E) and second end 121. The second shield electrode 24 may have a second longitudinal edge 30 aligned with the lateral direction 134 and facing away from the second external terminal 120 (illustrated in FIG. 1E) and second end 121. The second longitudinal edge 30 of the second shield electrode 24 may be offset from the first longitudinal edge 28 of the second shield electrode 24 by the shield electrode offset distance 32 in the longitudinal direction 132.

A first shield capacitive region 34 may be formed between the first longitudinal edges 28 of the first and second shield electrodes 119, 121. A second shield capacitive region 36 may be formed between the second longitudinal edges 30 of the first and second shield electrodes 119, 121. In some embodiments, a width 38 of the first longitudinal edge 28 in the lateral direction 134 may be less than a width 40 of the first shield electrode 22 in the lateral direction 134.

A first shield gap distance 42 may be formed in the longitudinal direction 132 between the first longitudinal edge 28 of the first shield electrode 22 and the first longitudinal edge 28 of the second shield electrode 24. A second shield gap distance 44 may be formed in the longitudinal direction 132 between the second lateral edge 30 of the first shield electrode 22 and the second lateral edge 30 of the second shield electrode 22.

In some embodiments, a third shield gap distance 46 may be formed between a third longitudinal edge 48 of the first shield electrode 22 and a third longitudinal edge 48 of the second shield electrode 24. A third shield capacitive region 51 may be formed between the third longitudinal edges 48 of the first and second shield electrodes 119, 121. In some embodiments, the third shield gap distance 46 may be approximately equal to the second shield gap distance 44 such that the third shield capacitive region 51 may be substantially similar in size and shape to the second shield capacitive region 36. For example, in some embodiments the first shield electrode 22 and/or second shield electrode 24 may be symmetric in the lateral direction 134 about a longitudinal centerline 50 that extends in the longitudinal direction 132.

In other embodiments, however, the third shield gap distance 46 may be greater than or less than the second shield gap distance 44 such that the third capacitive region 51 is differently sized and/or shaped than the second capacitive region 36 and produces a different capacitance than the second capacitive region.

It should be understood that, in some embodiments, one or more of the shield electrodes 22, 24 may be rectangular. In other words, the shield electrode offset distance 32 may be zero or approximately zero such that the first longitudinal edge 28 and second longitudinal edge 30 are aligned or approximately aligned.

Figure 2A:
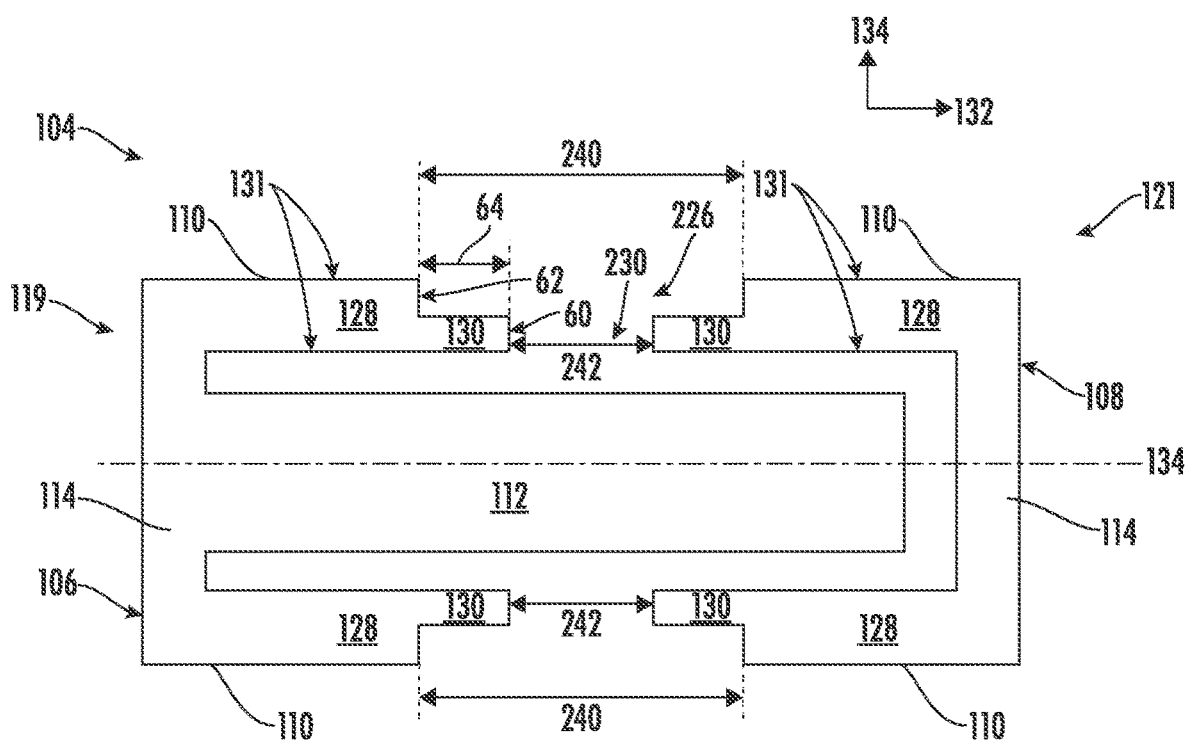
FIG. 2A illustrates a top view of another embodiment of an active electrode layer according to aspects of the present disclosure.
Figure 2B:
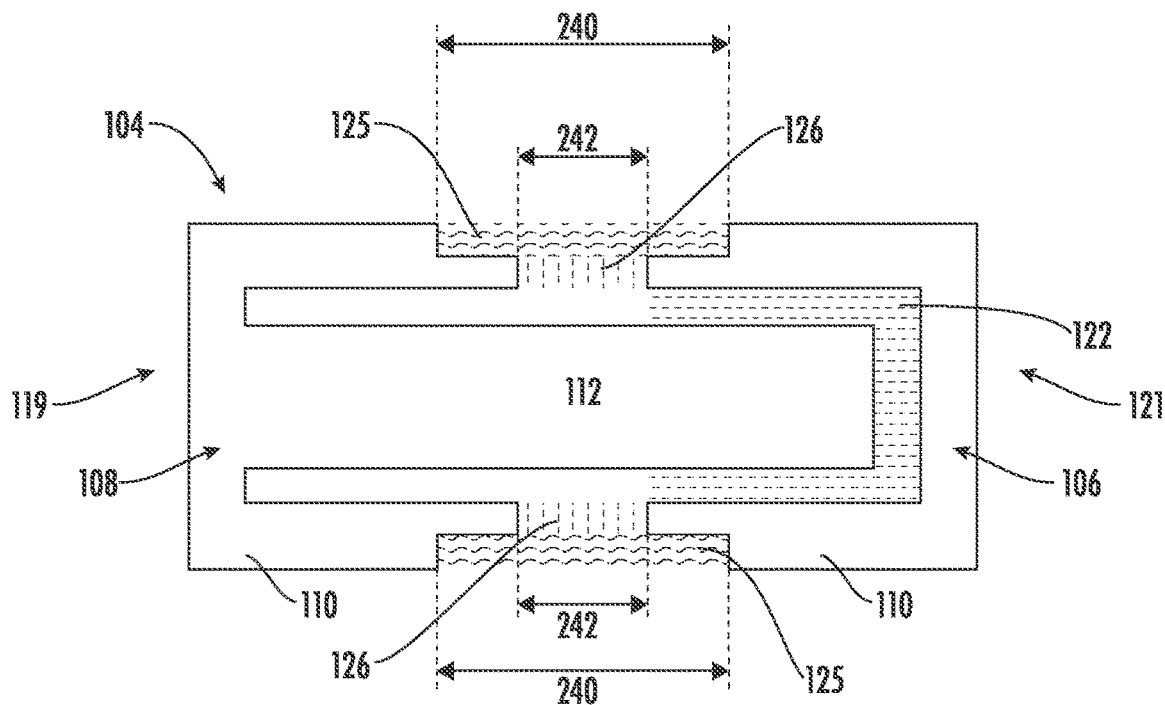
FIG. 2B illustrates a top down view of the embodiment of the active electrode layer of FIG. 2A in which multiple capacitive regions are formed according to aspects of the present disclosure.
Figure 2C:
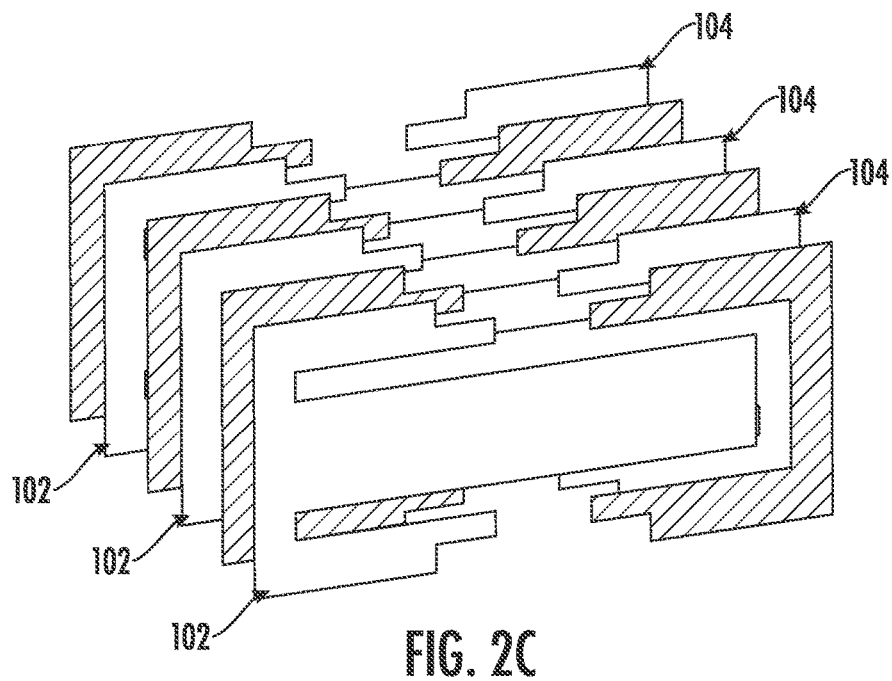
FIG. 2C illustrates a perspective view of alternating electrode layers configured as shown in FIG. 2A according to aspects of the present disclosure.

FIGS. 2A and 2B illustrate another embodiment of the first and second electrode layers 102, 104. More specifically, each electrode layer 102, 104 may include a first electrode 106 and a second electrode 108. The first electrode 106 may have a base portion 114. A pair of electrode arms 110 and at least one central portion 112 may extend from the base portion 114. The second electrode 108 may have a base portion 114 that extends along a longitudinal edge of the second electrode layer 108. The second electrode 106 may have a pair of electrode arms 110 extending from the base portion 114. The electrode regions 12, 14, 16 may generally be non-overlapping.

Referring to FIG. 1E, in some embodiments, the broadband multilayer ceramic capacitor 100 may have a capacitor thickness 56 in the Z-direction 136 between the top surface 18 and the bottom surface 20.

The dielectric region 12 may have a dielectric region thickness 58 in the Z-direction 136. In some embodiments, a ratio of the capacitor thickness 56 to the dielectric region thickness 58 may range from about 1.1 to about 20, in some embodiments from about 1.5 to about 10, in some embodiments from about 1.7 to about 5.

The active electrode region 14 may be an active electrode region thickness 59 in the Z-direction 136. The active electrode region 14 may be free of shield electrodes 22, 24, and/or may include only overlapping electrodes. The active electrode region thickness 59 may be defined between the lowest active electrode layer 19 and a highest electrode layer 65. A ratio of the capacitor thickness 56 to the active electrode region thickness 59 may range from about 1.1 to about 20.

The shield electrode region 16 may have a shield electrode region thickness 61 in the Z-direction 136. The shield electrode region thickness 61 may be defined between the bottom surface 20 of the capacitor 100 and a lowest electrode layer 19 of the plurality of active electrodes. A ratio of the capacitor thickness 56 to the shield electrode region thickness 61 may range from about 1.1 to about 20, in some embodiments from about 1.5 to about 10, in some embodiments from about 1.7 to about 5.

In some embodiments, a shield-to-bottom-surface distance 63 may be defined as a distance between the shield electrodes 22, 24 and the bottom surface 20 of the capacitor 100. If multiple shield electrode layers are included, the shield-to-bottom-surface distance 63 may be defined as the distance between the lowest of the shield electrode layers and the bottom surface 20. A ratio of the capacitor thickness 56 to the shield-to-bottom-surface distance 63 may range from about 1.1 to about 20, in some embodiments from about 1.5 to about 10, in some embodiments from about 1.7 to about 5.

In some embodiments, the shield electrodes 22, 24 may be spaced apart from the active electrodes 106, 108 by a first shield-to-active distance 67. A ratio of the first shield-to-active distance 67 to the shield-to-bottom-surface distance 63 may range from about 1 to about 20, in some embodiments from about 2 to about 10, and in some embodiments from about 3 to about 5.

In addition, FIG. 2A illustrates electrode arms 110 that include a main portion 128 and a step portion 130. More specifically, an electrode arm 110 of the first electrode 106 may include a first longitudinal edge 60 that extends in the lateral direction 134 and may define an edge of the step portion 130. A second longitudinal edge 62 may extend in the lateral direction 134 and may define an edge of the main portion 128 of the arm 110. The first longitudinal edge 60 may be offset from the second longitudinal edge 62 in the longitudinal direction 132 by an arm offset distance 64. One or both electrode arms 110 of the first electrode 106 and/or second electrode 108 may include respective main and step portions 128, 130. For example both arms 110 of both electrodes 106, 108 may include respective main portions 128 and step portions 130, for example as illustrated in FIG. 2A. Main arm gaps 240 may be formed between the step portions 130 of aligned arms 110. Step arm gaps 242 may be formed between the main portions 128 of aligned arms 110.

Referring to FIG. 2B, several capacitive regions may be formed between the first electrode 106 and the second electrode 108 of the electrode configuration of FIG. 2A. For example, in some embodiments, a central capacitive region 122 may be formed between the central portion 112 of the first electrode 106 and the base portion 114 and/or arms 110 of the second electrode 108. In some embodiments, a main arm gap capacitive region 125 may be formed within the main arm gap 240, and a step gap capacitive region 126 may be formed within the step arm gap 242.

Figure 3A:
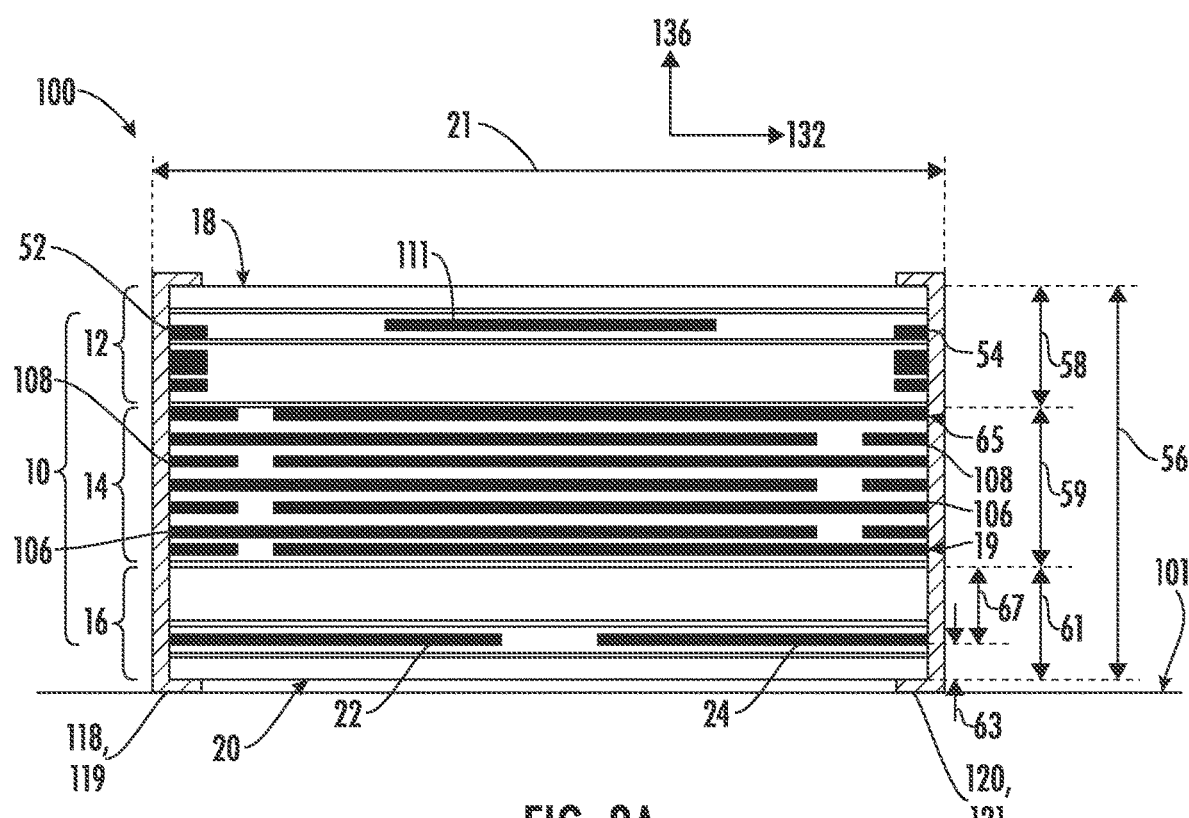
FIG. 3A a side cross sectional view of another embodiment of a capacitor including multiple regions in which active electrode layers are configured as shown in FIGS. 2A through 2C and a shield electrode layer is configured as shown in FIG. 1D according to aspects of the present disclosure.

Referring to FIG. 3A, in some embodiments, the dielectric region 12 may include first dummy tab electrodes 52 connected with the first termination and/or second dummy tab electrodes 54 connected with the second termination 120. More specifically, the dummy tab electrodes 52, 54 may be used to from (e.g., deposit) the terminations 118, 120, for example using a fine copper termination process. The dummy tab electrodes 52, 54 may extend less than 25% of the capacitor length 21 from the first end 119 or the second end 121.

The electrode configurations described herein may allow for a primary capacitive element between central portions 112 of adjacent electrode layers 102, 104 (i.e., parallel plate capacitance), as well as additional secondary capacitive elements, for example as described above with reference to FIGS. 1C, 1D, and 2B. These configurations are schematically depicted in FIGS. 4A and 4B.

In some embodiments, the capacitor 100 may include one or more floating electrodes 111. The floating electrode 111 may be positioned in the dielectric region 12. However, in other embodiments, the floating electrode 111 may be positioned in the active electrode region 14 and/or shield electrode region 16. In general, such floating electrodes 111 are not directly connected to an external terminal 118, 120.

However, in some embodiments, the floating electrode may be a part of a floating electrode layer containing at least one electrode that is electrically connected to an external terminal; however, such floating electrode layer contains at least one floating electrode that does not directly contact such electrode or external terminal.

The floating electrode may be positioned and configured according to any method known in the art. For instance, the floating electrode may be provided such that it overlaps at least a portion, such as a central portion, of a first active electrode and/or a second active electrode of an active electrode layer. In this regard, the floating electrode layer may be layered and disposed alternately with the first electrode layers and the second internal electrode layers; in this regard, such layers may be separated by the dielectric layers.

In addition, such floating electrodes may have any shape as generally known in the art. For instance, in one embodiment, the floating electrode layers may include at least one floating electrode having a dagger like configuration. For instance, such configuration may be similar to the configuration and shape of the first electrode as described herein. However, it should be understood that such first electrode may or may not contain an electrode arm with a step portion.

In addition, in one embodiment, the floating electrode layer may contain at least one floating electrode wherein the end of the floating electrode is adjacent at least one external terminal but does not contact such external terminal. In this regard, such gap may be referred to as a floating electrode gap in a longitudinal direction. Such floating electrode gap may be greater than 0%, such as about 3% or more, such as about 5% or more to about 50% or less, such as about 40% or less, such as about 30% or less, such as about 20% or less, such as about 10% or less the length of the capacitor in the longitudinal direction.

Figure 3B:
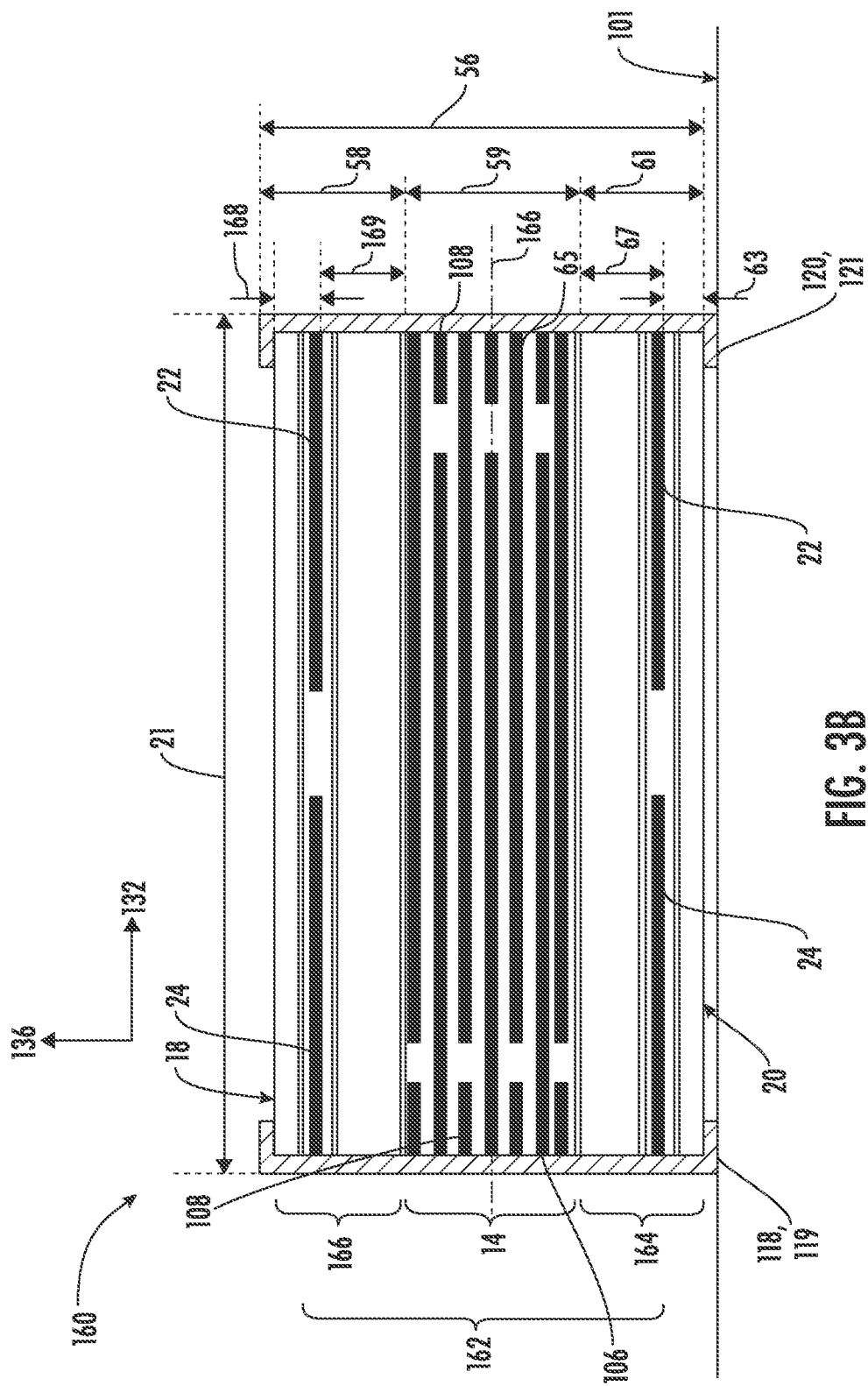
FIG. 3B illustrates another embodiment of a capacitor according to aspects of the present disclosure.

FIG. 3B illustrates another embodiment of a capacitor 160 according to aspects of the present disclosure. The capacitor 160 may include a plurality of electrode regions 162. The plurality of electrode regions 162 may include an active electrode region 14, a first shield electrode region 164 and a second shield electrode region 166. The active electrode region 14 may be located between the first shield electrode region 164 and the second electrode region 166.

In some embodiments, the capacitor 160, or a portion thereof, may be symmetric about a longitudinal centerline 167 that extends in the longitudinal direction. For example, the shield electrodes 22, 24 of the bottom shield electrode region 164 may be symmetric about the longitudinal centerline 167 with respect the shield electrodes 22, 24 of the top electrode region 166. In other words, the shield-to-bottom-surface distance 63 may be approximately equal to a shield-to-top-surface distance 168, which may be defined between the shield electrodes 22, 24 of the top shield electrode region 166 and the top surface 18 of the capacitor 160. For example, in some embodiments, a ratio of the shield-to-bottom-surface distance 63 to the shield-to-top-surface distance 168 may range from about 0.8 to about 1.2, in some embodiments from about 0.9 to about 1.1, in some embodiments from about 0.95 to about 1.05, and in some embodiments from about 0.98 to about 1.02.

The shield electrodes 22, 24 of the top shield electrode region 166 may be spaced apart from the active electrodes 106, 108 by a second shield-to-active distance 169. A ratio of the second shield-to-active distance 169 to the shield-to-top-surface distance 168 may range from about 1 to about 20, in some embodiments from about 2 to about 10, and in some embodiments from about 3 to about 5. Additionally, a ratio of the first shield-to-active distance 67 to the second shield-to-active distance 169 may range from about 0.8 to about 1.2, in some embodiments from about 0.9 to about 1.1, in some embodiments from about 0.95 to about 1.05, and in some embodiments from about 0.98 to about 1.02.

The capacitor 160 may exhibit comparable insertion loss characteristics in the first orientation (as illustrated) to a third orientation, in which the capacitor 160 is rotated 180 degrees about the longitudinal direction 132 (appearing substantially similar as illustrated). However, the second orientation of the capacitor 160 may be defined relative to the first orientation by rotation about the longitudinal direction 132 by 90 degrees, such that the shield electrodes 22, 24 are perpendicular to the mounting surface 101.

In the first orientation, the capacitor 160 may exhibit a first insertion loss value at a test frequency that is greater than about 2 GHz. The capacitor 160 may exhibit a second insertion loss value at about the test frequency in the second orientation relative to the mounting surface differs from the first insertion loss value by at least about 0.3 dB.

Figure 4:
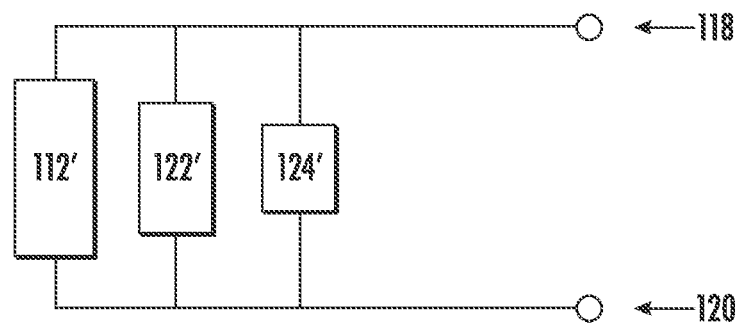
FIG. 4 depicts a circuit schematic representation of the embodiment of a capacitor illustrated in FIGS. 1A through 1E with multiple capacitive regions.

FIG. 4 schematically illustrates three capacitive elements of the electrode configuration of FIG. 1C: a primary capacitive element 112' between adjacent electrode layers, a central capacitive element 122', and an arm gap capacitive element 124'. The capacitive elements 112', 122' and 124' correspond with the central area 112, central capacitive region 122 and arm gap capacitive region 124, respectively of FIG. 1C. In addition, external terminals are depicted as 118 and 128 in FIG. 4.

Figure 5:
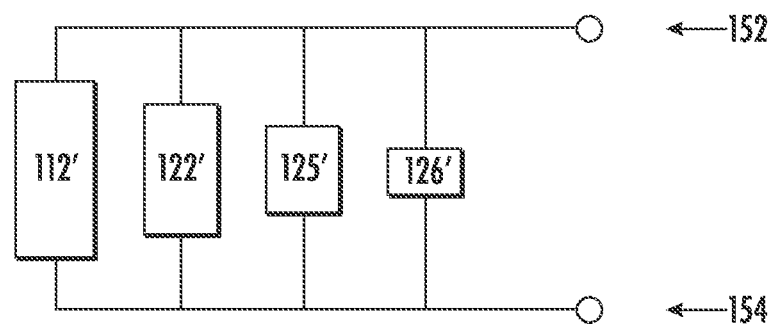
FIG. 5 depicts a circuit schematic representation of the embodiment of a capacitor illustrated in FIGS. 2A through 2C with multiple capacitive regions.

FIG. 5, schematically illustrates four capacitive elements of the electrode configuration of FIG. 2B, in which capacitive elements 112', 122' and 125', and 126' correspond with the central area 112, capacitive region 122, main arm gap capacitive region 125, and step gap capacitive region 126, respectively, of FIG. 2B. It should be understood that the dimensions of the various gaps may be selectively designed to achieve desired respective capacitance values for the capacitive elements illustrated in FIGS. 4 and 5. More specifically, the configuration of the capacitor and various parameters such as the number of electrode layers, the surface area of the overlapping central portions of electrode pairs, the distance separating electrodes, the dielectric constant of the dielectric material, etc., may be selected to achieve desired capacitance values. Nevertheless, the capacitor as disclosed herein may include an array of combined series and parallel capacitors to provide effective broadband performance.

In one exemplary ultra-broadband capacitor embodiment, primary capacitor 112' generally corresponds to a relatively large capacitance adapted for operation at a generally lower frequency range, such as on the order of between about several kilohertz (kHz) to about 200 megahertz (MHz), while secondary capacitors 122', 124', 125' and/or 126' may generally correspond to relatively smaller value capacitors configured to operate at a relatively higher frequency range, such as on the order of between about 200 megahertz (MHz) to many gigahertz (GHz).

Thus, the active electrodes may be configured to exhibit a plurality of capacitive elements within a single set of stacked electrodes. For instance, a primary capacitive element may be effective at relatively low frequencies while a secondary capacitive elements (e.g., the central capacitive region 122 and/or arm gap capacitive region 124) may be effective at relatively medium and/or high frequencies. For instance, the primary capacitance may be within 1 and 500 nF, such as within about 10 and 100 nF while the secondary capacitance may be within 1 and 500 pF, such as within 10 and 100 pF.

Figure 6:
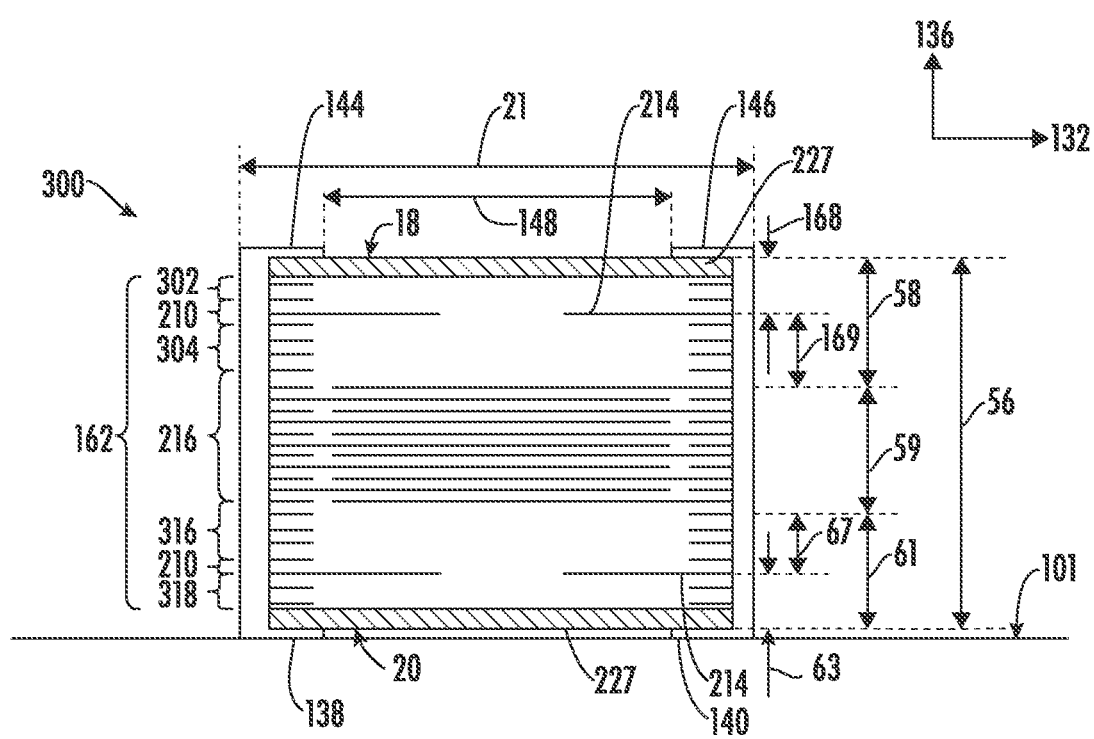
FIG. 6 illustrates simulated insertion loss data of the capacitor of FIGS. 1A through 1E in a first orientation, as shown in FIG. 1E, and a second orientation.

Referring to FIG. 6, in some embodiments, a multilayer capacitor 300 may include a first external terminal 118 disposed along a first end 119 and a second external terminal 120 disposed along a second end 121 that is opposite the first end 119 in the longitudinal direction 132. The multilayer capacitor 300 may include a plurality of dielectric layers and a plurality of electrode layers wherein the electrode layers are interleaved in an opposed and spaced apart relation with a dielectric layer located between each adjacent electrode layer.

In addition, as indicated above, the multilayer capacitor may include a shield electrode. For example, as illustrated in FIG. 6, the multilayer capacitor 300 may include a first shield region 210 and a second shield region 212, and each of the shield regions 210, 212 may include one or more shield electrode layers 214. The shield regions 210, 212 may be spaced apart from the active electrode region 216 by a dielectric region (for instance one not containing any electrode layers).

The shield electrode layers 214 may have a first shield electrode configuration, in which each shield electrode 220 is generally rectangular. In other embodiments, the shield electrode layers 214 may have a second shield electrode configuration, in which the shield electrodes 222 include a step 224, for example as explained above with reference to the electrodes of FIG. 1D.

In some embodiments, an active electrode 218 region may be disposed between the first and second shield regions 210, 212. The active electrode region 216 may include a plurality of alternating active electrode layers 218, for example, as explained with reference to FIGS. 2A-2D. Additionally, a pair of ceramic covers 227 may be disposed along the top and/or bottom surfaces of the capacitor 300. The ceramic covers 227 may include a dielectric material that is the same or similar to the dielectric material of the plurality of dielectric layers.

Referring to FIG. 6, in some embodiments, the multilayer capacitor 300 may also include anchor electrode regions 302, 304, 316, and/or 318. For example, the multilayer capacitor 300 may include a first anchor electrode region 304 on top of the active electrode region 216. Further, a shield electrode region 210 containing a shield electrode layer 214 may be positioned above, such as on top, of the first anchor electrode region 304. Additionally, a second anchor electrode region 302 may be positioned above, such as on top, of top of the shield electrode region 210. Similarly, the multilayer capacitor 300 may include a third anchor electrode region 316 below, such as immediately below, the active electrode region 216. Further, a shield electrode region 210 containing a shield electrode layer 214 may be positioned below, such as immediately below, the third anchor electrode region 316. Additionally, a fourth anchor electrode region 318 may be positioned below, such as immediately below, the shield electrode region 210. In this regard, the active electrode region 216 may be disposed between the first anchor electrode region 304 and the third anchor electrode region 316, for example. The active electrode region 216 may be configured as described above with reference to FIGS. 1A through 1C, FIGS. 2A through 2C, or as described below with reference to FIGS. 8A through 8D.

Figure 7A:
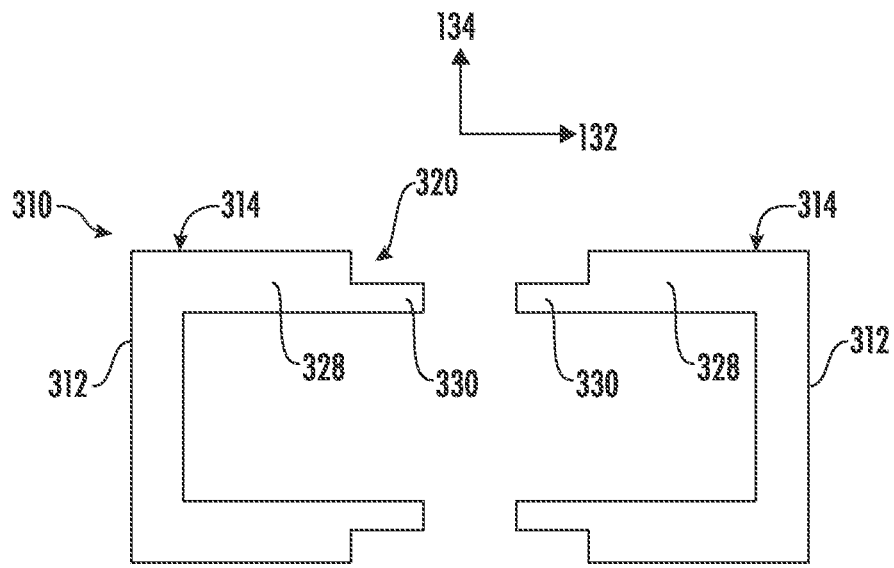
FIG. 7A through 7D illustrates top views of anchor electrodes, shield electrodes, and active electrodes of the capacitor of FIG. 6 in accordance with one embodiment of the present invention.

Referring to FIG. 7A, the anchor electrode regions 302, 304, 316, and/or 318 may include a plurality of anchor electrode layers 310, each having a pair of anchor electrodes 312. The anchor electrodes 312 may include a pair of electrode arms 314. Each electrode arm 314 of the anchor electrodes 312 may include a main portion 328 and a step portion 330, for example, in a similar manner as described above with reference to the electrodes of FIGS. 1A and 2.

Figure 7B:
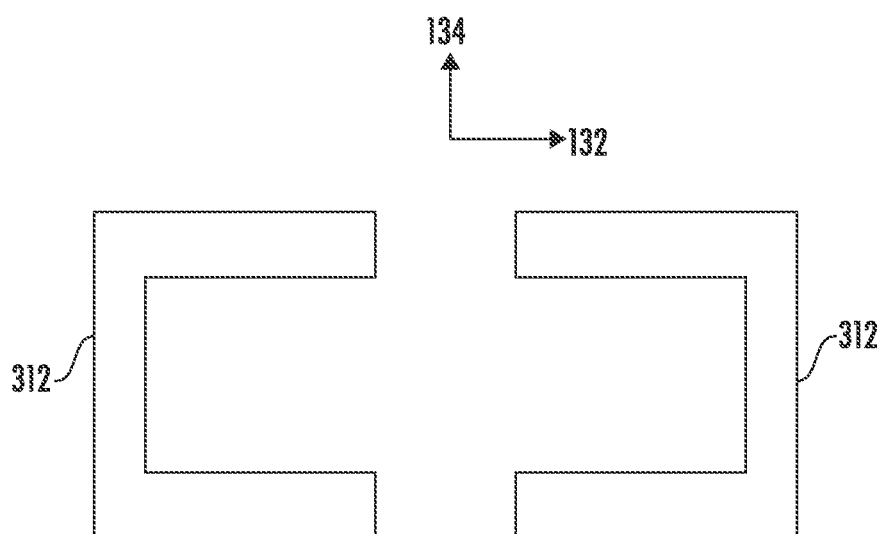
Figure 7C:
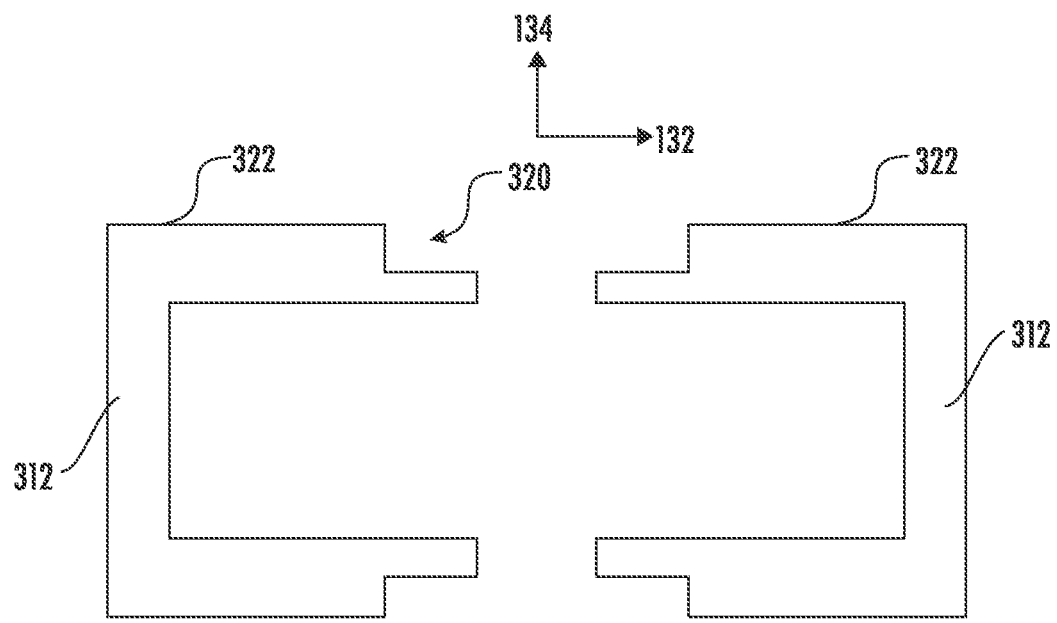
Figure 7D:
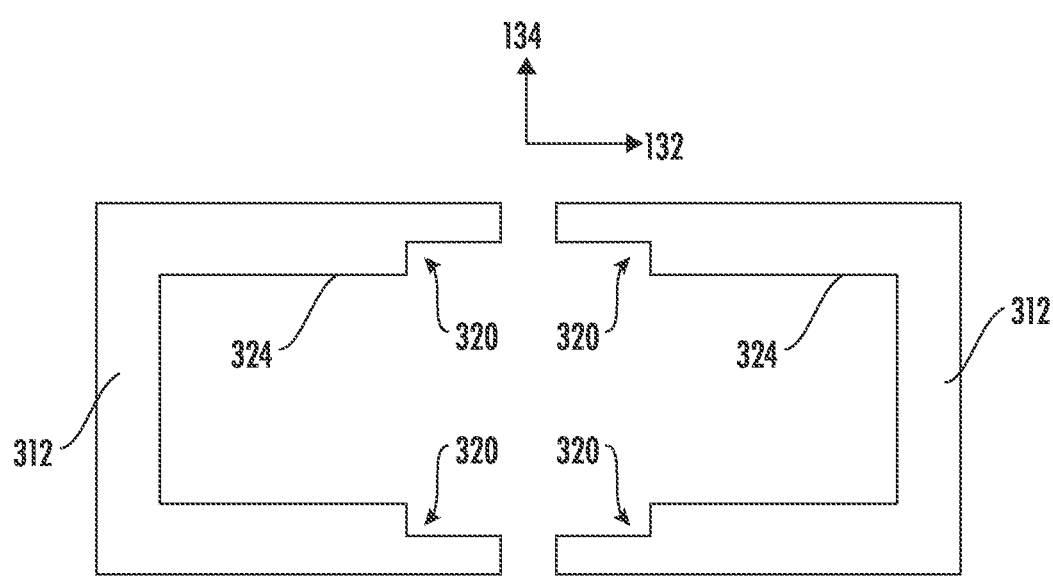

Referring to FIGS. 7B through 7D, the anchor electrodes 312 may have various configurations. For example, referring to FIG. 7B, in some embodiments, the electrode arms 314 of the anchor electrodes 312 may not include a step. For instance, such electrodes may be presented in a C-shaped configuration without a step. Referring to FIG. 7C, in some embodiments, the electrode arms 314 of the anchor electrodes 312 may include a step portion 320 that is inwardly offset from an outer lateral edge 322 of the anchor electrode 312. Referring to FIG. 7D, in other embodiments, the step portion 320 may be offset from an inner lateral edge 324 of the arms 314 of the anchor electrodes 312. Yet other configurations are possible. For example, in some embodiments, the step portion 320 may be offset from both the outer lateral edge 322 and the inner lateral edge 324.

Figure 8A:
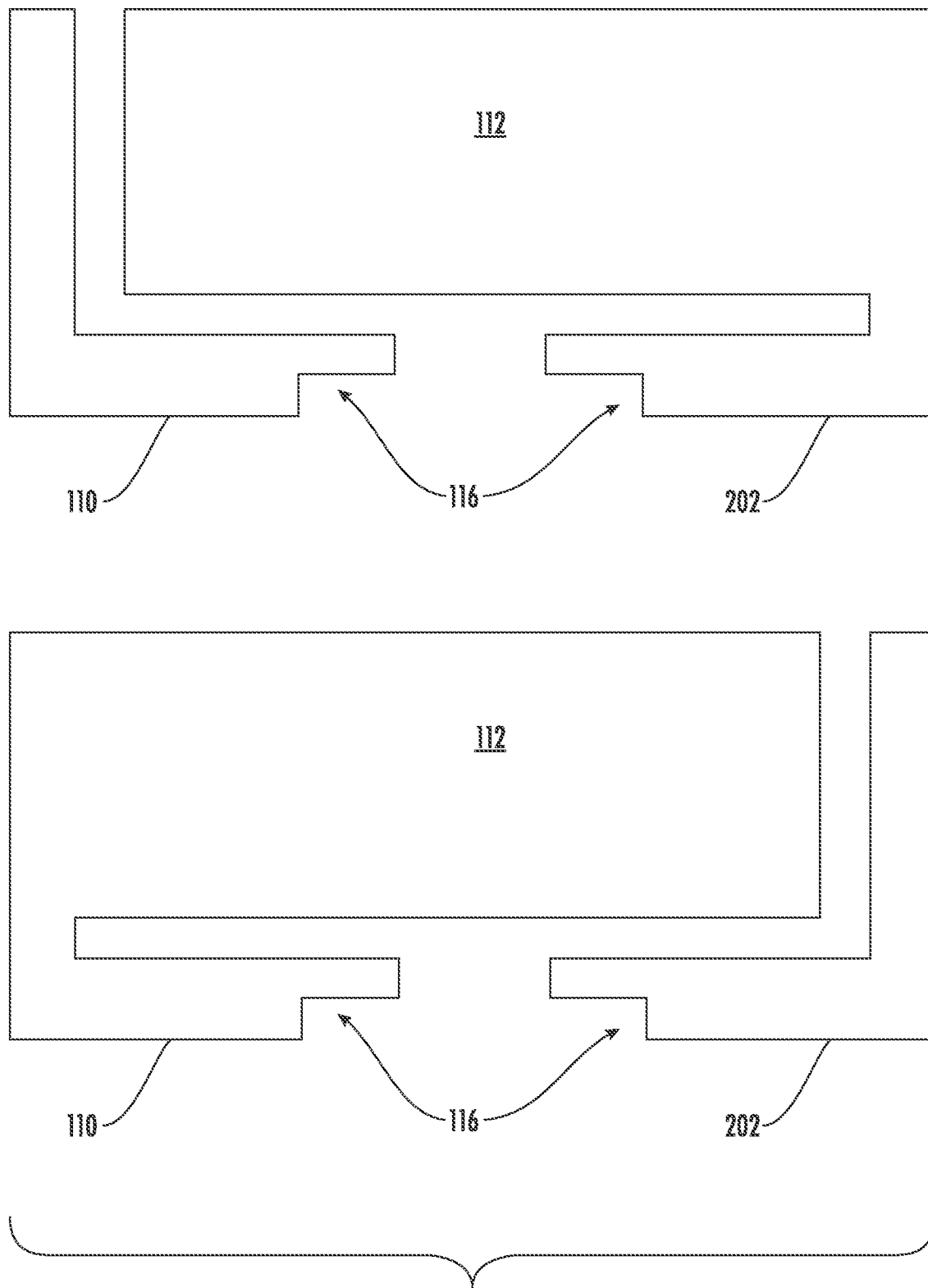
FIGS. 8A through 8D illustrate top views of additional embodiments of active electrode layers in accordance with certain embodiments of the present invention.
Figure 8B:
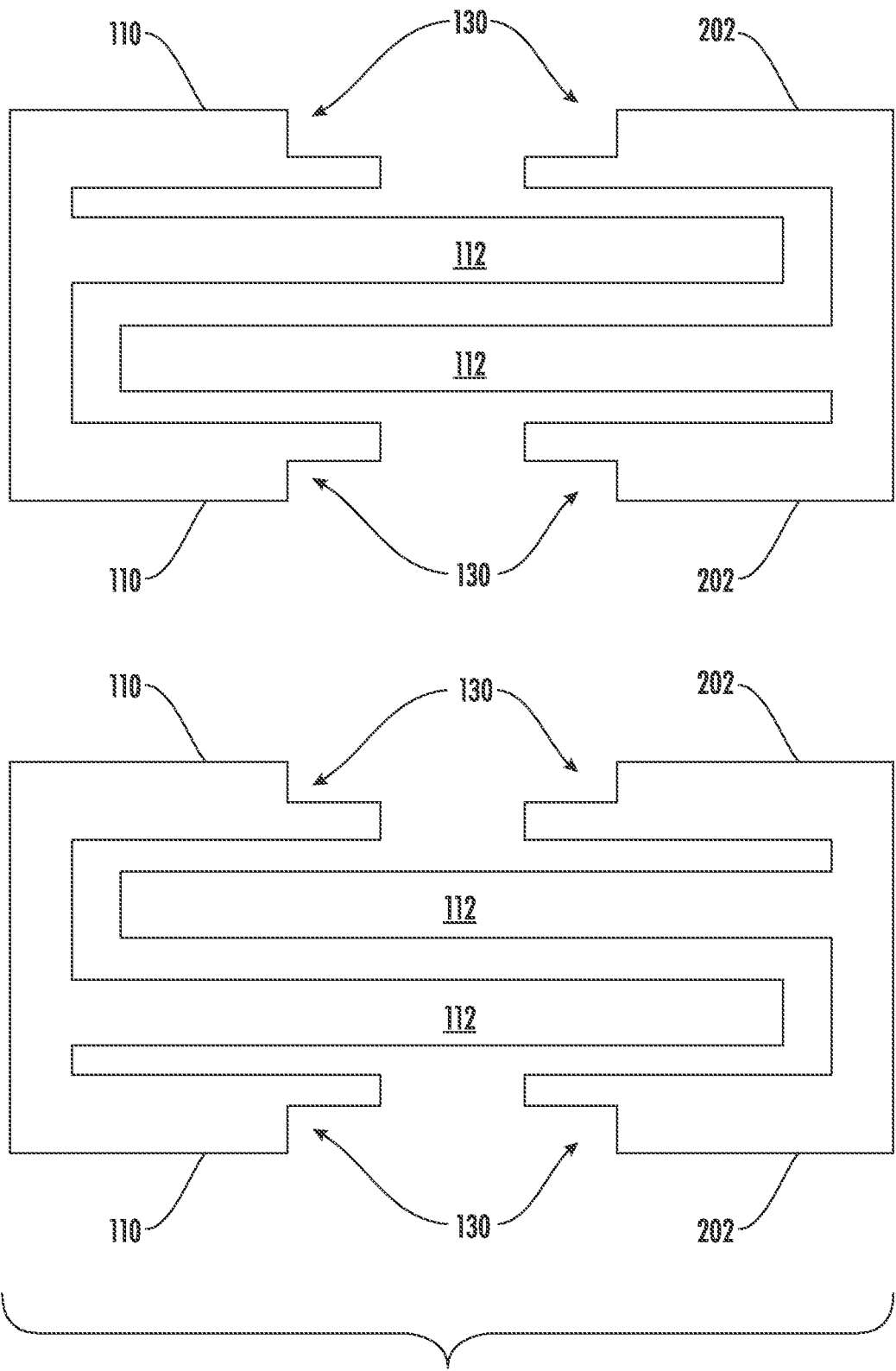
Figure 8C:
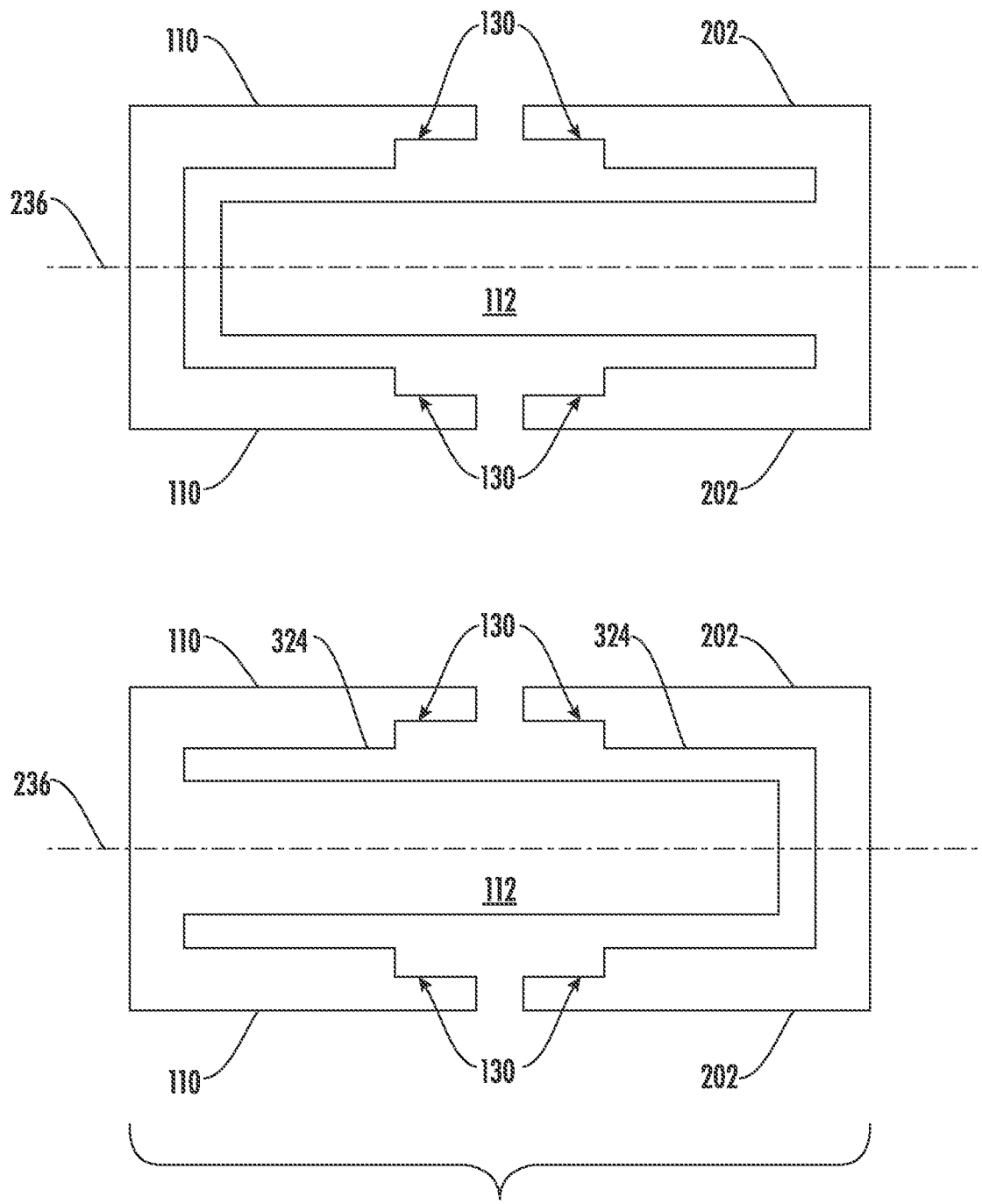
Figure 8D:
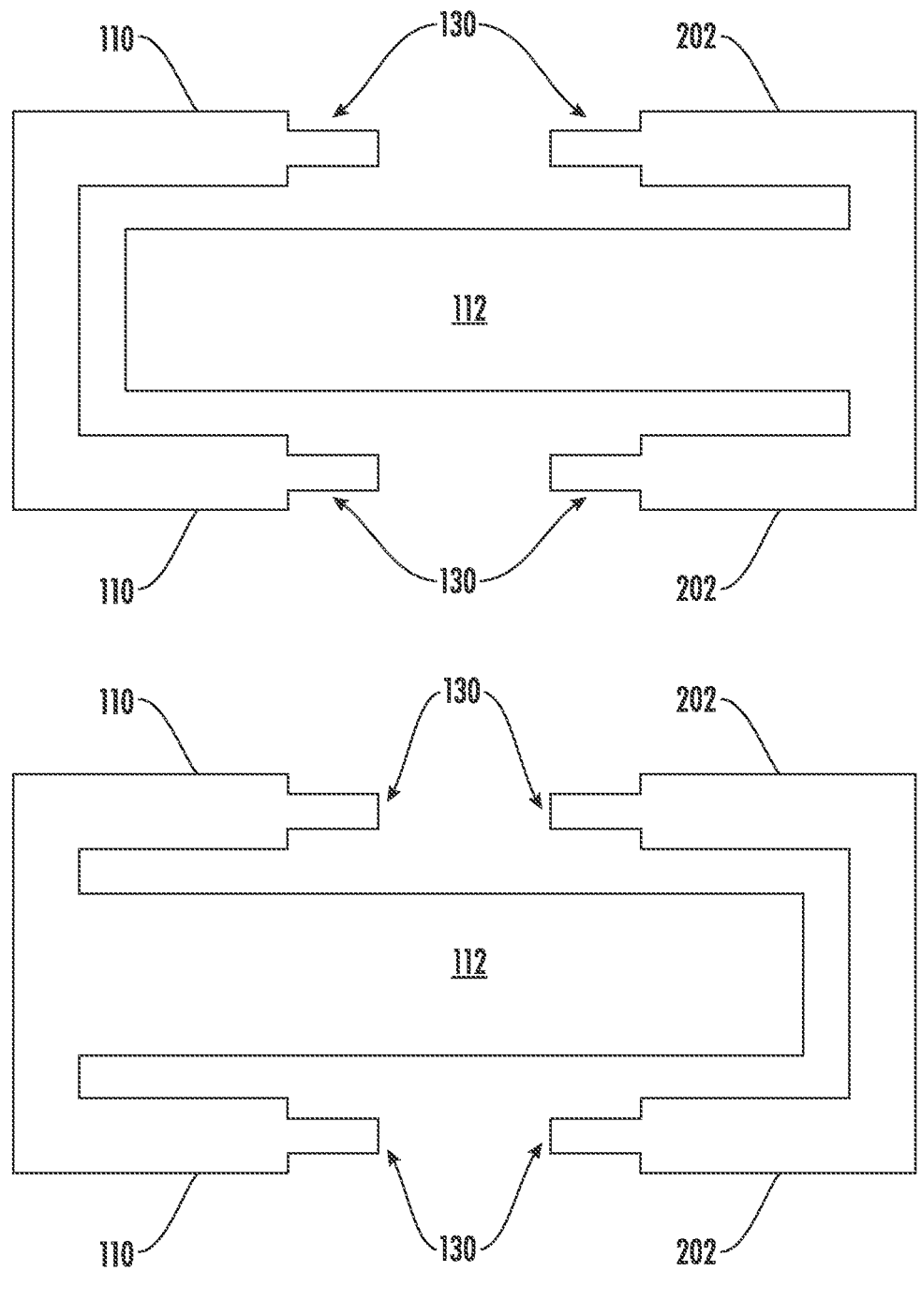

Referring to FIGS. 8A through 8C, in some embodiments, the active electrodes 106, 108 may have various other configurations. For example, referring to FIG. 8A, in some embodiments, each of the first electrodes 106 and second electrodes 108 may include a single arm 110, instead a pair of arms 110, 202 as described above with respect to FIG. 2. In this regard, such electrodes may include one electrode containing a central portion that extends from a base and one electrode arm that also extends from the base portion; meanwhile, the counter electrode may include a base portion and only one electrode arm extending from the base portion of such second electrode.

Referring to FIG. 8B, in some embodiments, each of the first electrodes 106 and second electrodes 108 may include central portions 112. For instance, each electrode 106, 108 may include a central portion 112 that extends from a respective base portion in addition to at least one electrode arm 110, 202, such as two electrode arms 110, 202, that extend from the respective base portion.

Referring to FIG. 8C, in some embodiments, the electrode arms 110, 202 of the electrodes 106, 108 may have a step portion 130 that is outwardly offset from an inner lateral edge 324 of the main portion of an electrode arm away from a lateral centerline 236 of the at least one of the electrodes 106, 108 of the electrode layers. Lastly, referring to FIG. 8D, in some embodiments, the electrode arms 110 of the electrodes 106, 108 may have step portions 130 that are offset from both the outer lateral edge 322 and the inner lateral edge 324 of the electrode arms 110, 202.

II. Insertion Loss

Aspects of the present disclosure are directed to a broadband multilayer capacitor that exhibits orientation sensitive insertion loss characteristics. The broadband multilayer capacitor can exhibit an insertion loss at a test frequency in a first orientation that varies greater than about 0.3 dB from an insertion loss at the test frequency in a second orientation. In the first orientation, the longitudinal direction 132 of the multilayer ceramic capacitor 100 may be parallel with the mounting surface 101 (for example as illustrated in FIG. 1E). In the first orientation, the electrodes (e.g., active electrodes 106, 108 and shield electrodes 22, 24) may be generally parallel with the mounting surface 101. Additionally, the shield electrode region 1 (including the shield electrodes 22, 24) may be located between the active electrode region 14 (including the plurality of active electrodes 106, 108) and the mounting surface 101, for example as illustrated in FIG. 1E, in the first orientation.

Referring to FIG. 9, in the second orientation, the multilayer ceramic capacitor 100 may be rotated 180 degrees about the longitudinal direction 136 with respect to the first orientation (illustrated in FIG. 1E). Thus, in the second orientation, the dielectric region 16 may be located between the active electrode region 14 and the mounting surface 101 with respect to the Z-direction 136.

The capacitor may exhibit a first insertion loss value at a test frequency that is greater than about 2 GHz in the first orientation and a second insertion loss value at the test frequency in second orientation. In some embodiments, the test frequency may range from about 10 GHz to about 30 GHz, or higher. The second insertion loss value may differ from the first insertion loss value by at least about 0.3 dB.

III. Test Methods

A testing assembly can be used to test performance characteristics, such as insertion loss and return loss, of a capacitor according to aspects of the present disclosure. For example, the capacitor can be mounted to a test board. An input line and an output line can each be connected with the test board. The test board can include microstrip lines, or test traces, electrically connecting the input line and output lines with respective external terminations of the capacitor. The test traces can be spaced apart by about 0.432 mm (0.017 in) or by about 0.610 mm (0.024 in).

An input signal can be applied to the input line using a source signal generator (e.g., a 1806 Keithley 2400 series Source Measure Unit (SMU), for example, a Keithley 2410-C SMU) and the resulting output signal of the capacitor can be measured at the output line (e.g., using the source signal generator). This test method can be repeated for multiple capacitors having the same design and nominal dimensions. The insertion loss results can be measured in the first orientation and second orientation. The difference between these insertion loss results can be calculated and averaged to determine the nominal insertion loss sensitivity values for the group of capacitors.

This procedure can be repeated for the various configurations of the capacitor described herein.

EXAMPLES

Eight multilayer ceramic capacitors having the configuration described above with FIGS. 1A through 1E were fabricated and tested for insertion loss response characteristics in the first orientation and second orientation. The multilayer ceramic capacitors had the following dimensions corresponding with the annotated dimensions of FIGS. 1A through 1E.

| Dimension | Reference Numeral | Length |
|---|---|---|
| Length | 21 | 1000 microns (0.04 in) |
| Width | — | 500 microns (0.02 in) |
| First shield gap distance | 42 | 51 microns (0.002 in) |
| Shield electrode offset distance | 32 | 150 microns (0.006 in) |
| Capacitor thickness | 56 | 510 microns (0.020 in) |
| Bottom-shield-to-bottom distance | 63 | 12.7 microns (0.0005 in) |
| Dielectric region thickness | 58 | 71.1 microns (0.0028 in) |
| Shield electrode region thickness | 61 | 71.1 microns (0.0028 in) |
| Active electrode region thickness | 59 | 367.8 microns (0.0145 in) |

Thus, the ratio of the length of the capacitor 21 to the shield electrode offset distance 32 was about 6.7. The ratio of the length of the capacitor 21 to the shield electrode offset distance 32 was about 6.7. The ratio of the second shield gap distance to the first shield gap distance was about 6.9. The ratio of the capacitor thickness to the bottom shield-to-bottom-surface distance was about 40.2.

The insertion loss response characteristics were measured for eight multilayer ceramic capacitors of the same design and nominal dimensions (within manufacturing tolerances). The insertion loss values were sampled at 30 GHz and 40 GHz for each of the eight multilayer ceramic capacitors in the first orientation and second orientations. The difference in insertion loss values for the first and second orientations at 30 GHz and 40 GHz was calculated for each capacitor. The resulting insertion loss delta values at 30 GHz and 40 GHz were averaged to determine the following average insertion loss delta values at 30 GHz and 40 GHz, respectively, between the first and second orientations:

| Test Frequency (GHz) | Average Insertion Loss Delta (dB) | Standard Deviation of Insertion Loss |
|---|---|---|
| 30 | 0.332 | 0.041 |
| 40 | 0.324 | 0.051 |

As shown in the above table, the average insertion loss for the fabricated multilayer ceramic capacitors is greater than 0.3 dB at both 30 GHz and 40 GHz with a standard deviation of 0.041 and 0.05 at 30 GHz and 40 GHz, respectively. The standard deviation of the average insertion loss delta values at 30 GHz and 40 GHz for the group of eight multilayer ceramic capacitors was also calculated as shown in the table above.

Figure 10:
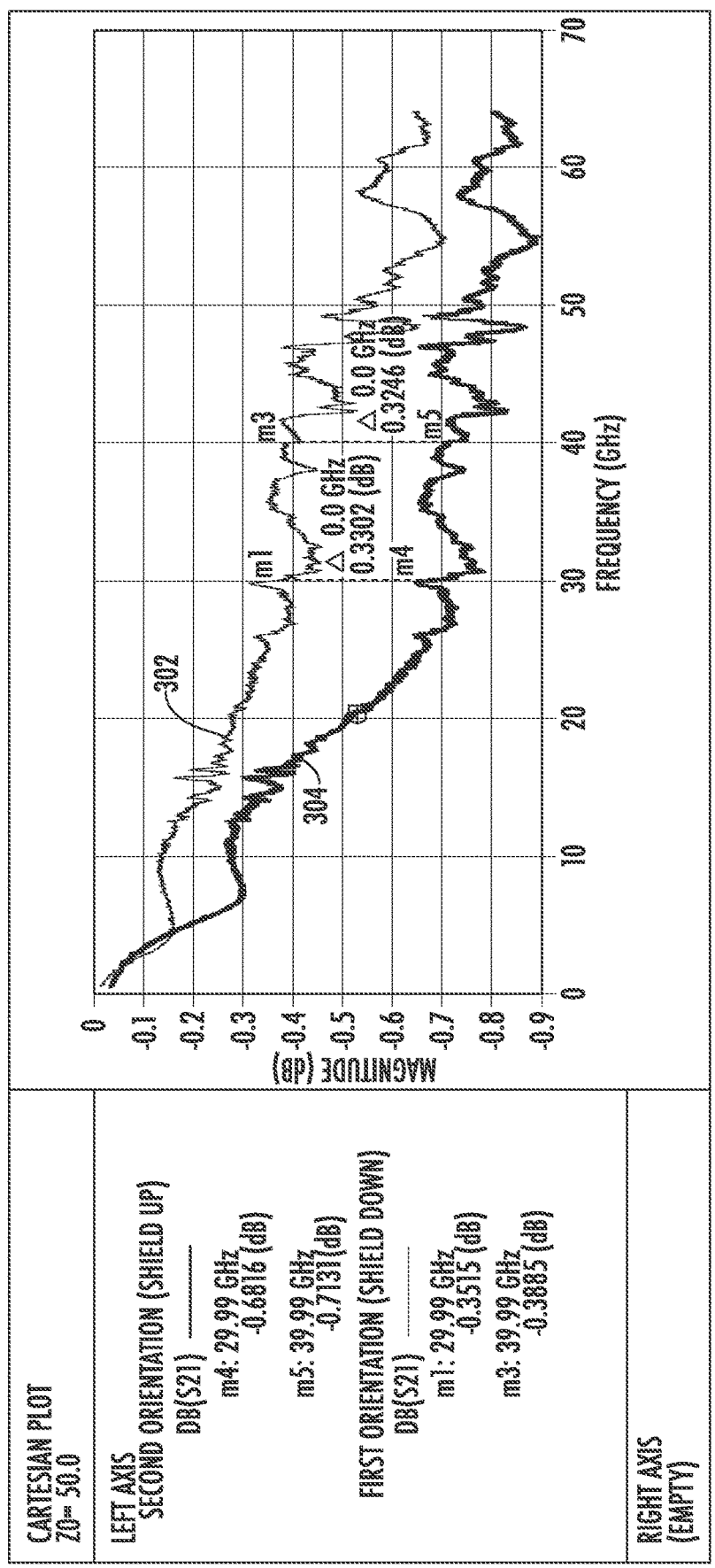
FIG. 10 depicts a representative insertion loss response curve that was measured for one multilayer ceramic of eight multilayer ceramic capacitors that were fabricated.

FIG. 10 depicts an insertion loss response curve of one of the one of the multilayer ceramic capacitors that exhibited insertion loss values very close to the average value above. The difference between the insertion loss in the first orientation and the insertion loss in the second orientation from the insertion loss response curve of FIG. 10 is the following:

| Test Frequency (GHz) | Insertion Loss (dB) |
|---|---|
| 30 | 0.330 |
| 40 | 0.325 |

Additionally, the capacitor may exhibit excellent insertion loss characteristics in the first orientation. Referring to FIG. 10, the insertion loss 302 in the first orientation is greater than about −0.8 dB at about 10 GHz, at about 20 GHz, at about 30 GHz, at about 40 GHz, at about 50 GHz, and at about 60 GHz. The insertion loss 302 in the first orientation is greater than about −0.5 dB at about 10 GHz, at about 20 GHz, at about 30 GHz, and at about 40 GHz.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A broadband multilayer ceramic capacitor having a first end and a second end that is spaced apart from the first end in a longitudinal direction that is perpendicular to a lateral direction, the lateral direction and longitudinal direction each being perpendicular to a Z-direction, the broadband multilayer ceramic capacitor comprising:
   a monolithic body comprising a plurality of dielectric layers;
   a first external terminal disposed along the first end;
   a second external terminal disposed along the second end;
   a plurality of active electrodes arranged within the monolithic body and parallel with the longitudinal direction; and
   at least one shield electrode arranged within the monolithic body and parallel with the longitudinal direction;
   wherein the broadband multilayer ceramic capacitor exhibits:
   a first insertion loss value at a test frequency and in a first orientation relative to the mounting surface in which the longitudinal direction of the multilayer ceramic capacitor is parallel with the mounting surface, the test frequency being greater than about 2 GHz; and
   a second insertion loss value at about the test frequency in a second orientation relative to the mounting surface in which the longitudinal direction of the multilayer ceramic capacitor is parallel with the mounting surface and the broadband multilayer ceramic capacitor is rotated 90 degrees or more about the longitudinal direction with respect to the first orientation, and wherein the second insertion loss value differs from the first insertion loss value by at least about 0.3 dB.

2. The broadband multilayer ceramic capacitor of claim 1, wherein the plurality of active electrodes are parallel with the mounting surface in the first orientation.

3. The broadband multilayer ceramic capacitor of claim 1, wherein, in the second orientation relative to the mounting surface, the multilayer ceramic capacitor is rotated 180 degrees about the longitudinal direction with respect to the first orientation relative to the mounting surface.

4. The broadband multilayer ceramic capacitor of claim 1, wherein, in the second orientation relative to the mounting surface, the multilayer ceramic capacitor is rotated 90 degrees about the longitudinal direction with respect to the first orientation relative to the mounting surface.

5. The broadband multilayer ceramic capacitor of claim 1, wherein the broadband multilayer ceramic capacitor exhibits an insertion loss in the first orientation that is greater than about −0.4 dB at about 10 GHz.

6. The broadband multilayer ceramic capacitor of claim 1, wherein the broadband multilayer ceramic capacitor exhibits an insertion loss in the first orientation that is greater than about −0.4 dB at about 20 GHz.

7. The broadband multilayer ceramic capacitor of claim 1, wherein the broadband multilayer ceramic capacitor exhibits an insertion loss in the first orientation that is greater than about −0.45 dB at about 30 GHz.

8. The broadband multilayer ceramic capacitor of claim 1, wherein the broadband multilayer ceramic capacitor exhibits an insertion loss in the first orientation that ranges from about −0.05 dB to about −0.4 dB from about 5 GHz to about 20 GHz.

9. The broadband multilayer ceramic capacitor of claim 1, wherein the broadband multilayer ceramic capacitor exhibits an insertion loss in the first orientation that ranges from about −0.05 dB to about −0.5 dB from about 20 GHz to about 40 GHz.

10. The broadband multilayer ceramic capacitor of claim 1, wherein, in the first orientation, the at least one shield electrode is closer to the mounting surface in the Z-direction than the plurality of active electrodes.

11. The broadband multilayer ceramic capacitor of claim 1, wherein, in the first orientation, the broadband multilayer ceramic capacitor is free of shield electrodes above the plurality of active electrode layers in the Z-direction.

12. The broadband multilayer ceramic capacitor of claim 1, wherein, in the first orientation, the broadband multilayer ceramic capacitor is free of shield electrodes above a lowest electrode layer of the plurality of active electrode layers in the Z-direction.

13. The broadband multilayer ceramic capacitor of claim 1, wherein the at least one shield electrode comprises:
   a first shield electrode that is parallel with the longitudinal direction, the first shield electrode connected with the first external terminal, the first shield electrode having a first longitudinal edge aligned with the lateral direction and facing away from the first external terminal, wherein the first shield electrode has a second longitudinal edge aligned with the lateral direction and facing away from the first external terminal, and wherein the second longitudinal edge is offset in the longitudinal direction from the first longitudinal edge by a shield electrode offset distance; and
   a second shield electrode connected with the second external terminal, the second shield electrode being approximately aligned with the first shield electrode in the Z-direction.

14. The broadband multilayer ceramic capacitor of claim 13, wherein the capacitor has a capacitor length in the longitudinal direction between the first end and the second end of the capacitor, and wherein a ratio of the capacitor length to the shield electrode offset distance is greater than about 2.

15. The broadband multilayer ceramic capacitor of claim 13, wherein the second shield electrode has a first longitudinal edge aligned with the lateral direction and facing away from the second external terminal, wherein the second shield electrode has a second longitudinal edge aligned with the lateral direction and facing away from the second external terminal, and wherein the second longitudinal edge is offset in the longitudinal direction from the first longitudinal edge by approximately the shield electrode offset distance.

16. The broadband multilayer ceramic capacitor of claim 15, wherein a first shield gap distance is formed in the longitudinal direction between the first longitudinal edge of the first shield electrode and the first longitudinal edge of the second shield electrode.

17. The broadband multilayer ceramic capacitor of claim 16, wherein the capacitor has a capacitor length in the longitudinal direction between the first end and the second end of the capacitor, and wherein a ratio of the capacitor length to the first shield gap distance is greater than about 2.

18. The broadband multilayer ceramic capacitor of claim 15, wherein a second shield gap distance is formed in the longitudinal direction between the second longitudinal edge of the first shield electrode and the second longitudinal edge of the second shield electrode.

19. A broadband multilayer ceramic capacitor having a first end and a second end that is spaced apart from the first end in a longitudinal direction that is perpendicular to a lateral direction, the lateral direction and longitudinal direction each being perpendicular to a Z-direction, the broadband multilayer ceramic capacitor comprising:
   a monolithic body comprising a plurality of dielectric layers;
   a first external terminal disposed along the first end;
   a second external terminal disposed along the second end;
   a plurality of active electrodes arranged within the monolithic body and parallel with the longitudinal direction; and
   at least one shield electrode arranged within the monolithic body and parallel with the longitudinal direction, the at least one shield electrode comprising a first shield electrode that is parallel with the longitudinal direction, the first shield electrode connected with the first external terminal, the first shield electrode having a first longitudinal edge aligned with the lateral direction and facing away from the first external terminal, the first shield electrode having a second longitudinal edge aligned with the lateral direction and facing away from the first external terminal, the second longitudinal edge offset in the longitudinal direction from the first longitudinal edge by a shield electrode offset distance,
   wherein the broadband multilayer ceramic capacitor exhibits:
   a first insertion loss value at a test frequency and in a first orientation relative to the mounting surface in which the longitudinal direction of the multilayer ceramic capacitor is parallel with the mounting surface, the test frequency being greater than about 2 GHz; and
   a second insertion loss value at about the test frequency in a second orientation relative to the mounting surface in which the longitudinal direction of the multilayer ceramic capacitor is parallel with the mounting surface and the broadband multilayer ceramic capacitor is rotated 90 degrees or more about the longitudinal direction with respect to the first orientation, and wherein the second insertion loss value differs from the first insertion loss value by at least about 0.3 dB; and
   wherein the capacitor has a capacitor length in the longitudinal direction between the first end and the second end of the capacitor, a ratio of the capacitor length to the shield electrode offset distance being greater than about 2.

20. A broadband multilayer ceramic capacitor having a first end and a second end that is spaced apart from the first end in a longitudinal direction that is perpendicular to a lateral direction, the lateral direction and longitudinal direction each being perpendicular to a Z-direction, the broadband multilayer ceramic capacitor comprising:
   a monolithic body comprising a plurality of dielectric layers;
   a first external terminal disposed along the first end;
   a second external terminal disposed along the second end;
   a plurality of active electrodes arranged within the monolithic body and parallel with the longitudinal direction; and
   at least one shield electrode arranged within the monolithic body and parallel with the longitudinal direction,
   wherein the broadband multilayer ceramic capacitor exhibits:
   a first insertion loss value at a test frequency and in a first orientation relative to the mounting surface in which the longitudinal direction of the multilayer ceramic capacitor is parallel with the mounting surface, the test frequency being greater than about 2 GHz, and
   a second insertion loss value at about the test frequency in a second orientation relative to the mounting surface in which the longitudinal direction of the multilayer ceramic capacitor is parallel with the mounting surface and the broadband multilayer ceramic capacitor is rotated 90 degrees or more about the longitudinal direction with respect to the first orientation, and wherein the second insertion loss value differs from the first insertion loss value by at least about 0.3 dB;
   wherein the at least one shield electrode comprises:
   a first shield electrode that is parallel with the longitudinal direction, the first shield electrode connected with the first external terminal, the first shield electrode having a first longitudinal edge aligned with the lateral direction and facing away from the first external terminal, the first shield electrode having a second longitudinal edge aligned with the lateral direction and facing away from the first external terminal, the second longitudinal edge offset in the longitudinal direction from the first longitudinal edge by a shield electrode offset distance, and
   a second shield electrode connected with the second external terminal, the second shield electrode having a first longitudinal edge aligned with the lateral direction and facing away from the second external terminal, the second shield electrode having a second longitudinal edge aligned with the lateral direction and facing away from the second external terminal, the second longitudinal edge is offset in the longitudinal direction from the first longitudinal edge by approximately the shield electrode offset distance, the second shield electrode being approximately aligned with the first shield electrode in the Z-direction, and
   a first shield gap distance formed in the longitudinal direction between the first longitudinal edge of the first shield electrode and the first longitudinal edge of the second shield electrode; and
   wherein the capacitor has a capacitor length in the longitudinal direction between the first end and the second end of the capacitor, and wherein a ratio of the capacitor length to the first shield gap distance is greater than about 2.

* * * * *